(12) United States Patent
Yang et al.

(10) Patent No.: US 10,546,862 B1
(45) Date of Patent: Jan. 28, 2020

(54) INTEGRATED ASSEMBLIES HAVING SPACERS OF LOW PERMITTIVITY ALONG DIGIT-LINES, AND METHODS OF FORMING INTEGRATED ASSEMBLIES

(71) Applicant: Micron Technology, Inc., Boise, ID (US)

(72) Inventors: Guangjun Yang, Boise, ID (US); Suraj J. Mathew, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/248,584

(22) Filed: Jan. 15, 2019

(51) Int. Cl.
*H01L 27/108* (2006.01)
*H01L 21/768* (2006.01)

(52) U.S. Cl.
CPC .. *H01L 27/10855* (2013.01); *H01L 21/76831* (2013.01); *H01L 27/10814* (2013.01); *H01L 27/10826* (2013.01); *H01L 21/76805* (2013.01)

(58) Field of Classification Search
None
See application file for complete search history.

(56) References Cited

U.S. PATENT DOCUMENTS

2010/0285662 A1* 11/2010 Kim .................... H01L 21/7682
438/675

* cited by examiner

*Primary Examiner* — Herve-Louis Y Assouman
(74) *Attorney, Agent, or Firm* — Wells St. John P.S.

(57) ABSTRACT

Some embodiments include an integrated assembly having active-region-pillars extending upwardly from a base. Each of the active-region-pillars has a pair of storage-element-contact-regions, and a digit-line-contact-region between the storage-element-contact-regions. The integrated assembly includes, along a cross-section, a first digit-line-contact-region adjacent a first storage-element-contact-region. The first digit-line-contact-region is recessed relative to the first storage-element-contact-region. A first digit-line is coupled with the first digit-line-contact-region. A second digit-line is laterally offset from the first digit-line. An insulative material is between the first digit-line and the first storage-element-contact-region. A cup-shaped indentation extends into the insulative material and the first storage-element-contact-region. Insulative spacers are along sidewalls of the first and second digit-lines, and include first material. First and second insulative pillars are over the first and second digit-lines, and include second material. Some embodiments include methods of forming integrated assemblies.

31 Claims, 21 Drawing Sheets

US 10,546,862 B1

INTEGRATED ASSEMBLIES HAVING SPACERS OF LOW PERMITTIVITY ALONG DIGIT-LINES, AND METHODS OF FORMING INTEGRATED ASSEMBLIES

TECHNICAL FIELD

Integrated assemblies having spacers of low permittivity along digit-lines, and methods of forming integrated assemblies.

BACKGROUND

Memory is one type of integrated circuitry, and is used in computer systems for storing data. An example memory is DRAM (dynamic random-access memory). DRAM cells may each comprise a transistor in combination with a capacitor. The DRAM cells may be arranged in an array; with wordlines extending along rows of the array, and with digit-lines extending along columns of the array. The wordlines may be coupled with the transistors of the memory cells. Each memory cell may be uniquely addressed through a combination of one of the wordlines with one of the digit-lines.

A problem with highly-integrated DRAM can be that capacitive coupling occurs between tightly-packed conductive structures. It is desirable to develop new architectures which address such problem, and to develop new methods for fabricating the architectures.

BRIEF DESCRIPTION OF THE DRAWINGS

FIG. 1 is a diagrammatic top-down view; FIG. 1C is a diagrammatic cross-sectional top-down view.

DETAILED DESCRIPTION OF THE ILLUSTRATED EMBODIMENTS

Some embodiments include integrated assemblies in which low-permittivity spacers (e.g., spacers having dielectric constants below 5, below 3.9, etc.) are provided between digit-lines and conductive interconnects adjacent the digit-lines; and some embodiments include methods of forming integrated assemblies. Example embodiments are described with reference to FIGS. 1-16.

Figure 1:
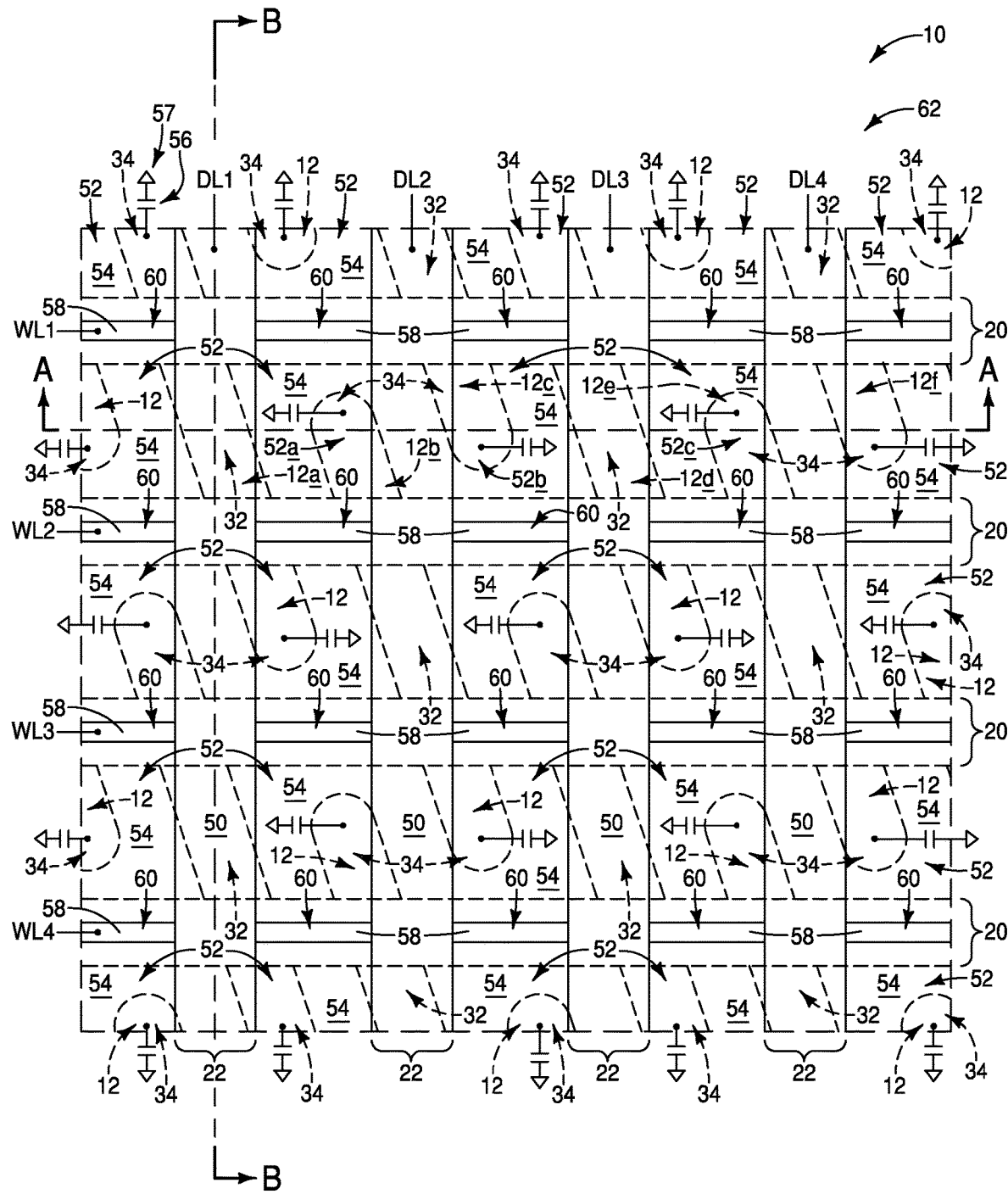
FIGS. 1-1C are diagrammatic views of a region of an example integrated assembly comprising an example memory array.
Figure 1A:
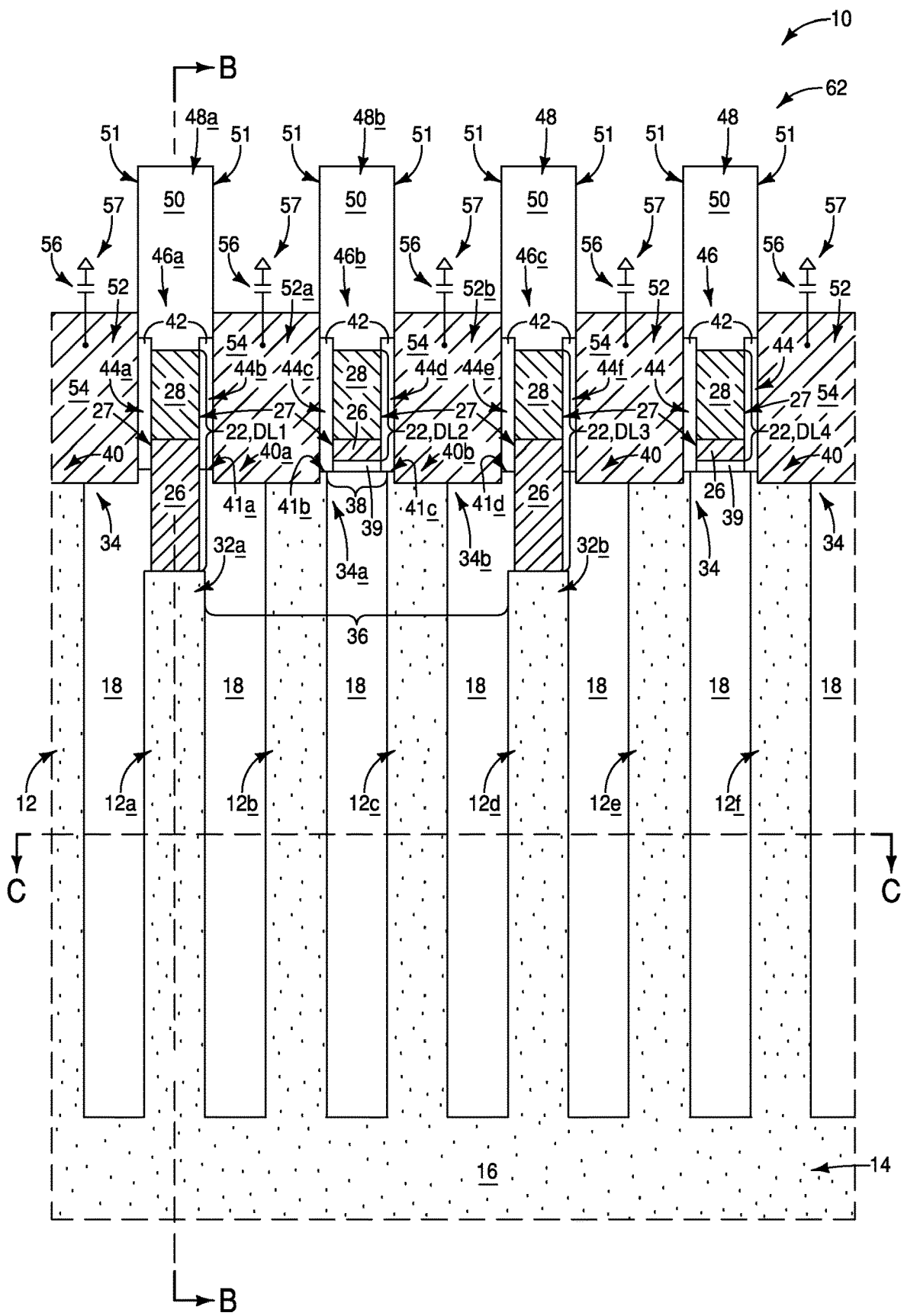
FIGS. 1A and 1B are diagrammatic cross-sectional side views. The view of FIG. 1A is along the lines A-A of FIGS. 1, 1B and 1C. The view of FIG. 1B is along the lines B-B of FIGS. 1, 1A and 1C. The view of FIG. 1C is along the lines C-C of FIGS. 1A and 1B.
Figure 1B:
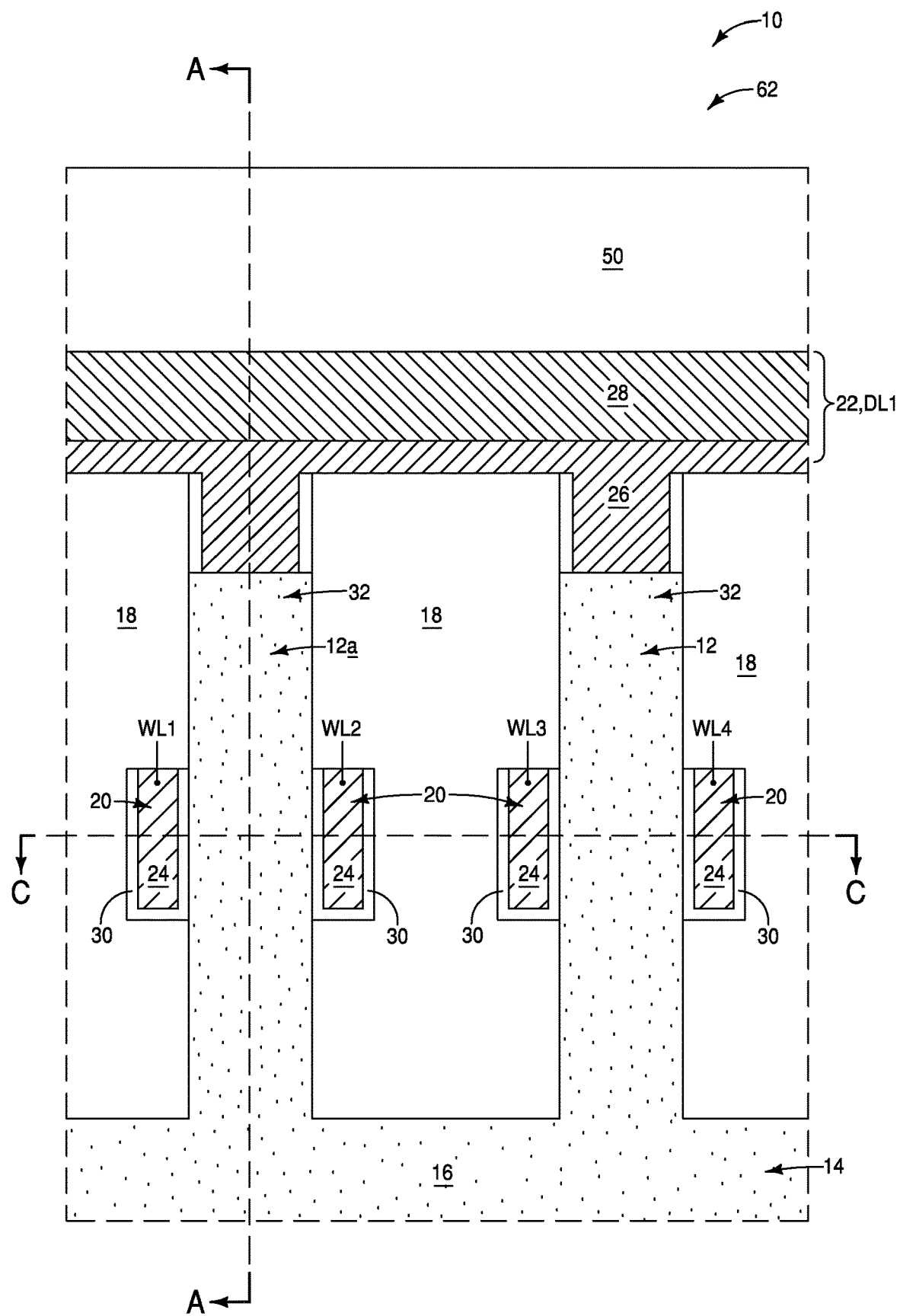
Figure 1C:
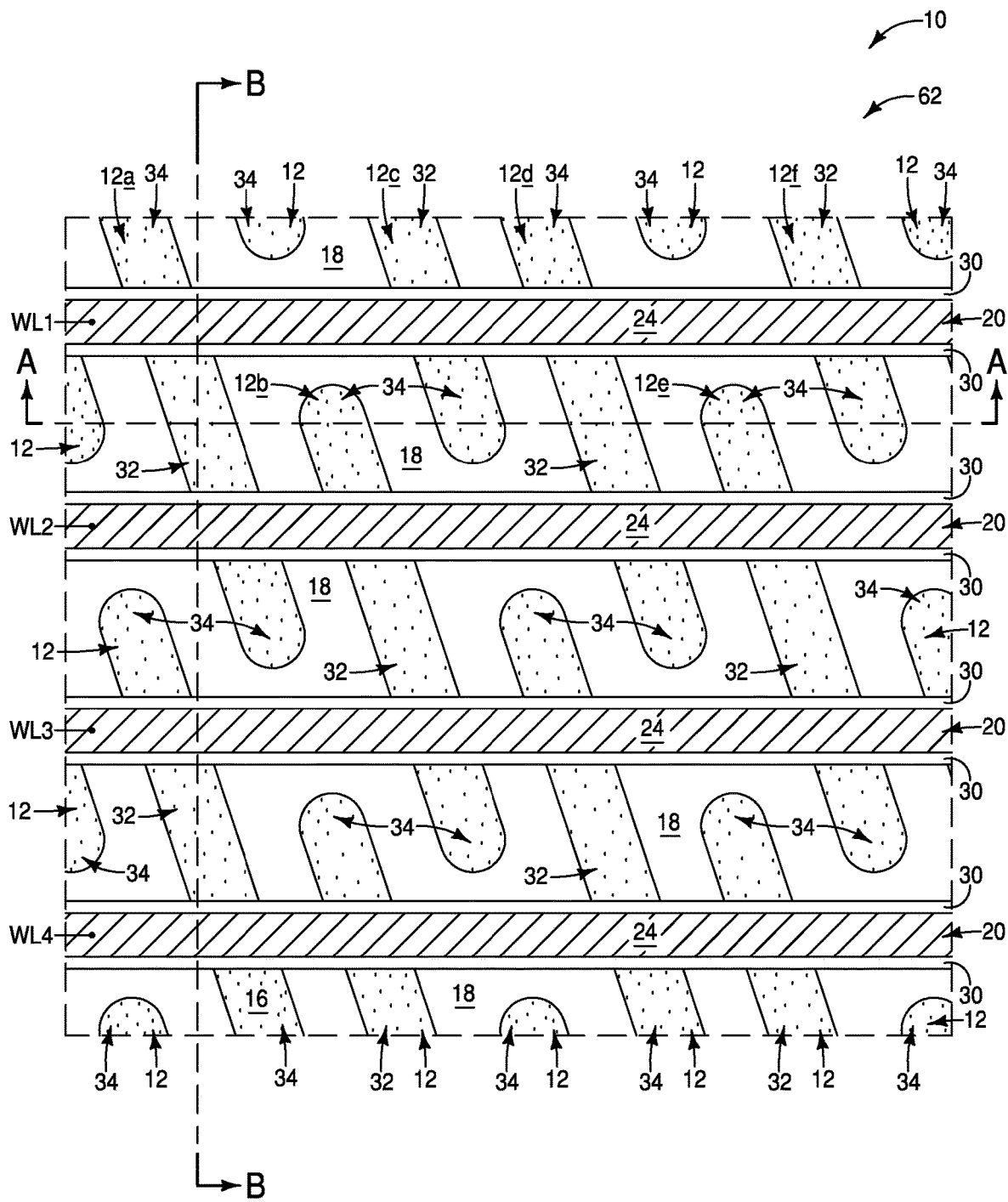

Referring to FIGS. 1-1C, a portion of an example integrated assembly 10 is illustrated. Such assembly may be formed with any suitable methodology. The assembly 10 includes a plurality of active regions 12 (also referred to herein as active-region-pillars) extending upwardly from a semiconductor base 14. Some of the active regions 12 are labeled as 12a-f so that they may be distinguished relative to one another, and relative to others of the active regions. All of the active regions 12 may be substantially identical to one another; with the term "substantially identical" meaning identical to within reasonable tolerances of fabrication and measurement. The active regions 12 are illustrated with dashed lines (phantom view) in FIG. 1 in order to indicate that they are under other materials.

The active regions 12 and semiconductor base 14 comprise semiconductor material 16. Such semiconductor material may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 16 may comprise, consist essentially of, or consist of appropriately-doped silicon. The silicon may be in any suitable form; and in some embodiments may be monocrystalline silicon. In some embodiments, the semiconductor material 16 of the active regions may be referred to as active-region-material.

The base 14 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

The active regions 12 are spaced from one another by regions comprising insulative material 18. The insulative material 18 may comprise any suitable composition or combination of compositions; and in some embodiments may comprise, consist essentially of, or consist of one or both of silicon dioxide and silicon nitride.

Wordlines (i.e., access lines) 20 (also labeled as WL1-WL4) extend along a first direction (represented by an x-axis). The first direction may correspond to a row direction of a memory array. The wordlines 20 are illustrated with dashed lines (phantom view) in FIG. 1 in order to indicate that they are under other materials. The wordlines are adjacent to the active-region-pillars 12. The wordlines 20 comprise conductive material 24. The conductive material 24 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

Gate dielectric material 30 extends around lower regions of the wordlines 20, and is between the wordlines and the active regions 12. The gate dielectric material 30 may comprise any suitable composition(s); and in some embodiments may comprise, consist essentially of, or consist of silicon dioxide.

Digit-lines (i.e., sense-lines, bitlines) 22 (also labeled as DL1-DL4) extend along a second direction (represented by a y-axis) which may correspond to a column direction of the memory array. The second direction (i.e., the column direction) may be orthogonal to the first direction (i.e., the row direction), or may simply cross the first direction. The digit-lines 22 comprise conductive materials 26 and 28. The conductive materials 26 and 28 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 28 may be a metal-containing material (e.g., may include one or more titanium, titanium nitride, titanium silicide, tungsten, tungsten nitride, tungsten silicide, etc.); and the conductive material 26 may comprise a doped semiconductor material (e.g., may comprise n-type silicon).

Each of the active regions (i.e., active-region-pillars) 12 may be considered to comprise a digit-line-contact-region 32 between a pair of storage-element-contact-regions 34. In some embodiments, the regions 32 and 34 may be generically referred to as contact regions. The wordlines 20 comprise transistor gates which gatedly couple the storage-element-contact-regions 34 with the digit-line-contact-regions 32.

The cross-section of FIG. 1A shows that the digit-line-contact-regions 32 are recessed relative to the storage-element-contact-regions 34. The cross-section of FIG. 1A shows two of the digit-line-contact-regions 32 labeled as 32a and 32b. The regions 32a and 32b may be referred to as first and second digit-line-contact-regions in the discussion that follows. Also, the cross-section of FIG. 1A shows two of the storage-element-contact-regions 34 labeled as 34a and 34b. The regions 34a and 34b may be referred to as first and second storage-element-contact-regions in the discussion that follows. Notably, the first digit-line-contact-region 32a is adjacent the first storage-element-contact-region 34a along the cross-section of FIG. 1A. Also, the first and second storage-element-contact-regions 34a and 34b are between the first and second digit-line-contact-regions 32a and 32b along the cross-section of FIG. 1A. In some embodiments, the first and second digit-line-contact-regions 32a and 32b may be considered to be spaced from one another by a first intervening region 36, and the first and second storage-element-contact-regions 34a and 34b may be considered to be within such first intervening region. Also, the first and second storage-element-contact-regions 34a and 34b may be considered to be spaced from one another by a second intervening region 38.

In some embodiments, the digit-line DL1 may be referred to as a first digit-line coupled with the first digit-line-contact-region 32a, and the digit-line DL2 may be referred to as a second digit-line which is laterally offset from the first digit-line. The insulative material 18 is between the first digit-line DL1 and the first storage-element-contact-region 34a. A cup-shaped indentation 40a extends into the insulative material 18 and the first storage-element-contact-region 34a. The cup-shaped indentation 40a has a first upper ridge 41a along an upper surface of the insulative material 18, and has a second upper ridge 41b along an upper surface of the first storage-element-contact-region 34a. It is noted that even though the upper ridges 41a and 41b appear to be separate structures in the cross-section of FIG. 1A, such upper ridges 41a and 41b may actually be part of a continuous ridge that extends entirely around the cup-shaped indentation 40a.

The cup-shaped indentation 40a may be considered to be representative of a plurality of substantially identical cup-shaped indentations 40. In the illustrated embodiment, the cup-shaped indentations 40 have bottom surfaces which are approximately coplanar across the insulative material 18 and the storage-element-contact-regions 34. In other embodiments, the bottom surfaces may have other configurations. For instance, in some embodiments portions of the storage-element-contact-regions 34 may be recessed relative to the insulative material 18 (or vice versa) along the bottom surfaces of the cup-shaped indentations.

The digit-line DL2 passes over the intervening region 38 between the storage-element-contact-regions 34a and 34b; and in the shown embodiment is over an insulative material 39. The insulative material 39 may comprise any suitable composition(s); and in some embodiments may comprise, consist essentially of, or consist of silicon dioxide.

In some embodiments, the digit-line DL1 may be referred to as a first digit-line coupled with the first digit-line-contact-region 32a and extending upwardly from such first digit-line-contact-region, the digit-line DL3 may be referred to as a second digit-line coupled with the second digit-line-contact-region 32b and extending upwardly therefrom, and the digit-line DL2 may be referred to as a third digit-line passing over the intervening region 38. The cup-shaped indentation 40a may be referred to as a first-shaped indentation, and a second-shaped indentation 40b extends into the second storage-element-contact-region 34b. The insulative material 18 between the digit-line DL1 and the storage-element-contact-region 34a may be referred to as first insulative material, and the insulative material 18 between the digit-line DL3 and the storage-element-contact-region 34b may be referred to as second insulative material. The first cup-shaped indentation 40a extends into the first insulative material and the first storage-element-contact-region 34a, and the second cup-shaped indentation 40b extends into the second insulative material and the second storage-element-contact-region 34b. The second cup-shaped indentation 40b has a third upper ridge 41c along a surface of the second storage-element-contact-region 34b, and has a fourth upper ridge 41d along an upper surface of the second insulative material 18.

Insulative spacers 44 are along sidewall surfaces 27 of the digit-lines 22. The insulative spacers 44 comprise insulative material 42 (which may also be referred to as first insulative material, or simply as first material). In some embodiments, the insulative material 42 may have low permittivity; and, for example, may have a dielectric constant (k) less than or equal to about 5, less than or equal to about 3.9, less than or equal to about 3.7, etc. In some embodiments, the material 42 may have a dielectric constant less than that of silicon dioxide, and accordingly may correspond to a low-k material. The material 42 may comprise any suitable composition(s); and in some embodiments may comprise, consist essentially of, or consist of one or more of porous silicon dioxide, carbon-doped silicon dioxide and porous silicon nitride.

In some embodiments, the insulative spacers 44 along the sidewall surfaces of the digit-line DL1 may be referred to as first and second insulative spacers 44a and 44b, and the insulative spacers 44 along the sidewall surfaces of the digit-line DL2 may be referred to as third and fourth insulative spacers 44c and 44d. The second and third insulative spacers 44b and 44c contact the first and second upper ridges 41a and 41b. A first recess 46a is between the upper regions of the first and second insulative spacers 44a and 44b, and is over the digit-line DL1; and a second recess 46b is between the third and fourth insulative spacers 44c and 44d, and is over the digit-line DL2. A first insulative pillar 48a is over the first and second insulative spacers 44a and 44b, and extends into the first recess 46a; and a second insulative pillar 48b is over the third and fourth insulative spacers 44c and 44d, and extends into the second recess 46b. The insulative pillars 48 comprise insulative material 50 (which may also be referred to as second insulative material).

The second insulative material 50 may have a dielectric constant greater than that of the first insulative material 42. In some embodiments, the second insulative material 50 has a dielectric constant greater than 5, greater than or equal to 7.5, etc. In some embodiments, the dielectric constant of the first insulative material 42 may be referred to as a first dielectric constant, and the dielectric constant of the second insulative material 50 may be referred to as a second dielectric constant.

The second insulative material 50 may comprise any suitable composition(s). For example, in some embodiments the second insulative material 50 may comprise, consist essentially of, or consist of silicon nitride.

In some embodiments, the insulative spacers along the digit-line DL1 may be referred to as first and second insulative spacers 44a and 44b, the insulative spacers along the digit-line DL3 may be referred to as third and fourth insulative spacers 44e and 44f, and the insulative spacers along the sidewalls of the digit-line DL2 may be referred to as fifth and sixth insulative spacers 44c and 44d. In such embodiments, the fifth and sixth insulative spacers 44c and 44d may be considered to contact the second and third upper ridges 41b and 41c, the second insulative spacer 44b may be considered to contact the first upper ridge 41a, and the third insulative spacer 44e may be considered to contact the fourth upper ridge 41d. In such embodiments, the recess 46a may be considered to be a first recess, the recess 46c may be considered to be a second recess, and the recess 46b may be considered to be a third recess. The insulative pillar 48a may be considered to be a first insulative pillar, the insulative pillar 48c may be considered to be a second insulative pillar, and the insulative pillar 46b may be considered to be a third insulative pillar.

Conductive interconnects 52 extend to within the cup-shaped indentations 40. In some embodiments, the conductive interconnect within the indentation 40a may be referred to as a first conductive interconnect 52a and the conductive interconnect within the indentation 40b may be referred to as a second conductive interconnect 52b.

The conductive interconnects 52 comprise conductive material 54. The conductive material 54 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In the shown embodiment, the conductive material 54 of the interconnects 52 directly contacts sidewall surfaces 51 of the insulative pillars 48.

Storage-elements 56 are electrically coupled with the conductive interconnects 52. The illustrated example storage-elements 56 are configured as capacitors. Each of the capacitors 56 has a node connected with a reference voltage 57. The reference voltage may be ground or any other suitable voltage. In some embodiments, other storage-elements may be utilized instead of the capacitors 56. Any suitable device having two or more detectable states may be utilized as a storage-element; including, for example, devices comprising phase change material, conductive-bridging material, etc. The storage-elements 56 are coupled with the storage-element-contact-regions 34 through the interconnects 52.

The top view of FIG. 1 shows insulative blocks 60 between neighboring interconnects 52 along a common column (i.e., the blocks 60 separate interconnects 52 which neighbor along the y-direction). The blocks 60 comprise insulative material 58. The insulative material 58 may comprise any suitable composition(s); and in some embodiments may comprise, consist essentially of, or consist of one or more of silicon oxide, silicon nitride, etc.

An advantage of the utilization of the low-permittivity material 42 for the spacers 44 is that such may alleviate capacitive coupling between the interconnects 52 and the digit-lines 22 as compared to conventional architectures. Such may enable architectures of the present invention to be scaled to higher levels of integration than conventional architectures. It is noted that the insulative material 50 of the pillars 48 may comprise any suitable composition, but in some embodiments would not benefit from having low permittivity. Instead, high permittivity compositions may be desired for utilization in insulative material 50 in order to provide desired structural rigidity and/or to achieve desired isolation relative to other structures (not shown) which may be formed over construction 10 in later processing.

Figure 2:
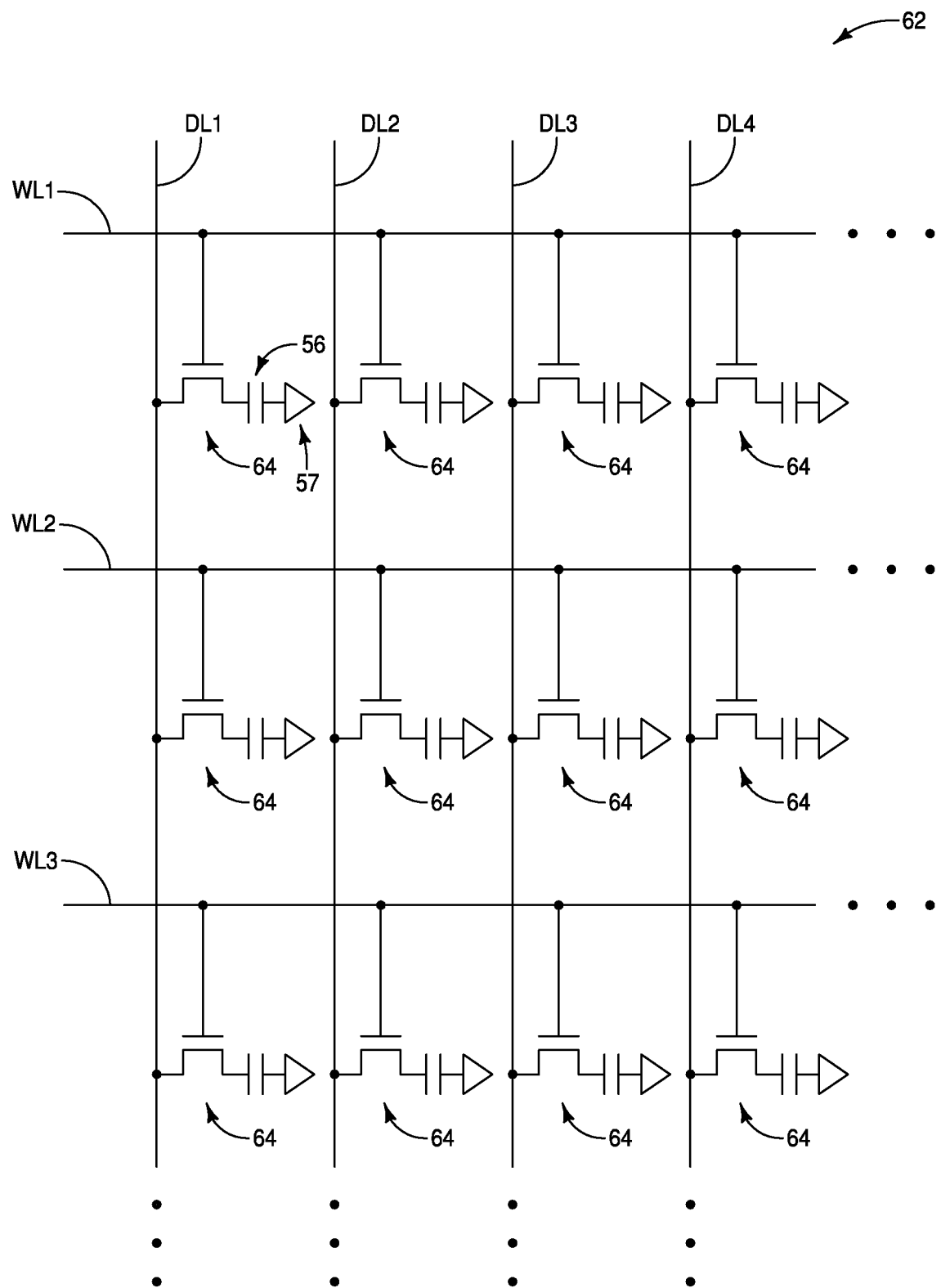
FIG. 2 is a diagrammatic schematic view of a region of an example memory array.

The construction 10 of FIGS. 1-1C may be considered to comprise example memory cells of a memory array 62. The memory array may have any suitable configuration, and in some embodiments may be a DRAM array. An example DRAM array 62 is schematically illustrated in FIG. 2. The DRAM array 62 includes the digit-lines DL1-DL4, and includes the wordlines WL1-WL4. Memory cells 64 comprise transistors coupled with the capacitors 56. Each of the memory cells 64 is uniquely addressed through the combination of a wordline and a digit-line.

Figure 3:
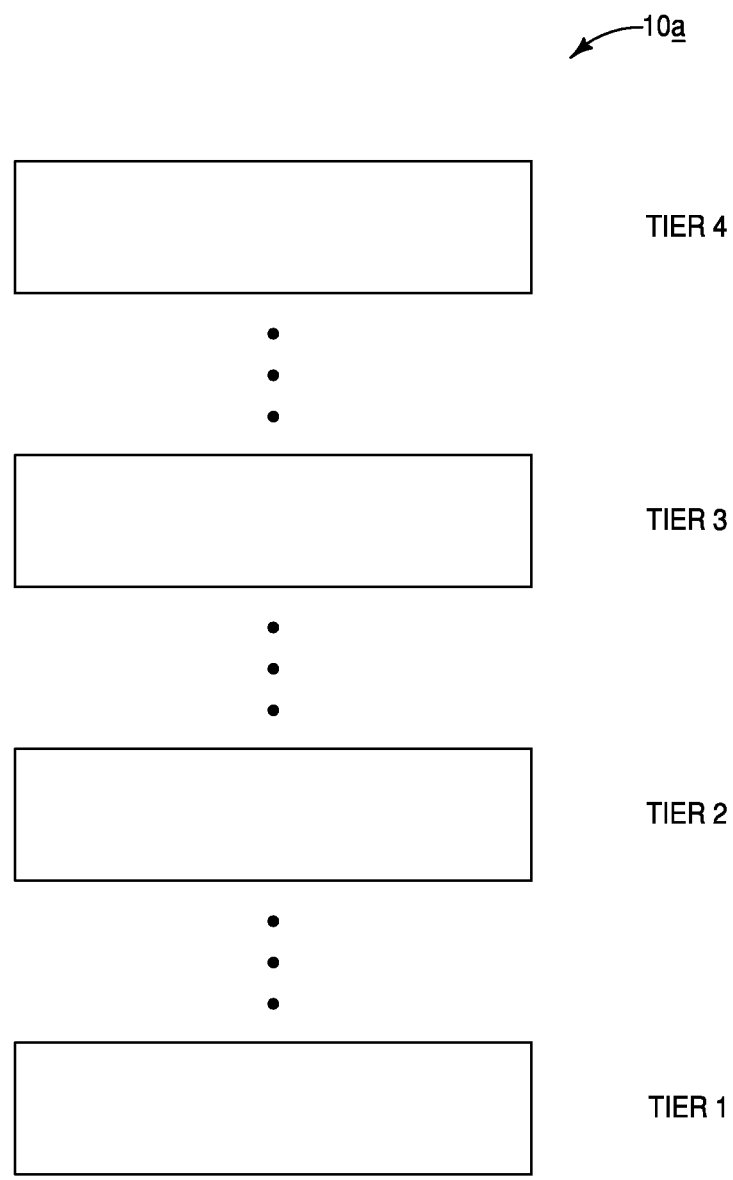
FIG. 3 is a diagrammatic cross-sectional side view of a region of an example assembly comprising stacked tiers.

In some embodiments, the memory array 62 may be within a memory tier (i.e., memory deck) which is within a vertically-stacked arrangement of tiers (or decks). For instance, FIG. 3 shows a portion of an integrated assembly 10a comprising a vertically-stacked arrangement of tiers 1-4. The vertically-stacked arrangement may extend upwardly to include additional tiers. The tiers 1-4 may be considered to be examples of levels that are stacked one atop the other. The levels may be within different semiconductor dies, or at least two of the levels may be within the same semiconductor die.

Individual tiers may include control circuitry and/or sensing circuitry (e.g., may include wordline drivers, sense amplifiers, etc.); and/or may include memory arrays, such as, for example, the memory array 62. The memory arrays within the various tiers may be the same as one another (e.g., may all be DRAM arrays), or may be different relative to one another (e.g., some may be DRAM arrays, while others are NAND arrays).

The memory arrays described above may be formed with any suitable processing. Example processing which may be utilized to form the array 62 of FIGS. 1-1C is described with reference to FIGS. 4-16.

Figure 4:
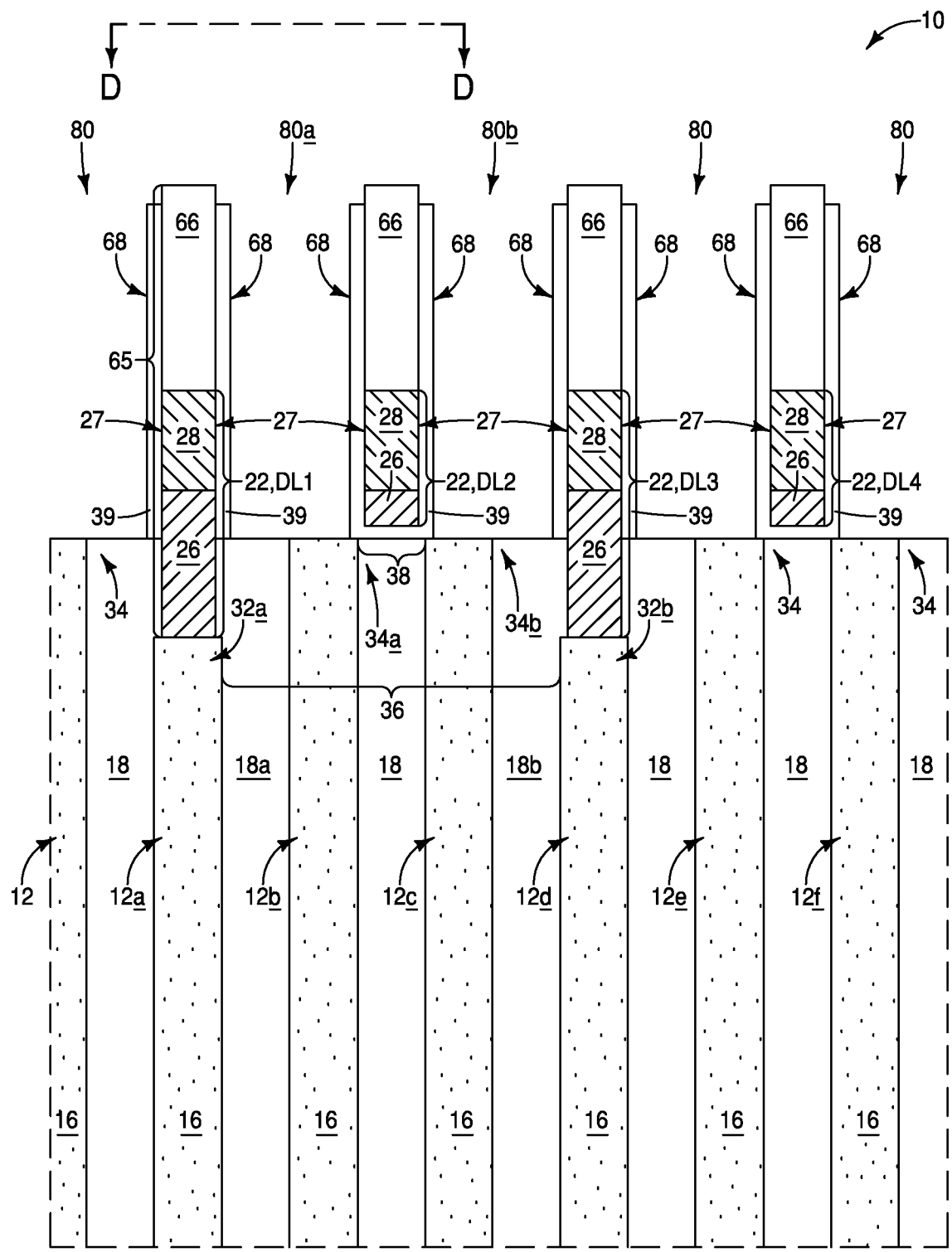
FIGS. 4-14 are diagrammatic cross-sectional side views of an example integrated assembly at example process stages of an example method for fabricating an example memory array.

Referring to FIG. 4, the integrated assembly (construction) 10 is shown at an initial process stage after the semiconductor material 16 has been patterned to form the pillars 12 extending upwardly from the base 14 (the base is not shown in FIG. 4 and the figures following FIG. 4, but it is to be understood that such base would be present). The construction is shown along the same cross-section as FIG. 1A. The digit-line-contact-regions 32 are recessed relative to the storage-element-contact-regions 34. The first and second digit-line-contact-regions 32a and 32b are spaced from one another by the first intervening region 36, and the first and second storage-element-contact-regions 34a and 34b are spaced from one another by the second intervening region 38.

The first digit-line DL1 is formed to be coupled with the first digit-line-contact-region 32a, the second digit-line DL3 is formed to be coupled with the second digit-line-contact-region 32b, and the third digit-line DL2 is formed to pass over the second intervening region 38. The digit-lines have the sidewall surfaces 27.

A first insulative material 18a is between the first digit-line DL1 and the first storage-element-contact-region 34a, and a second insulative material 18b is between the second digit-line DL3 and the second storage-element-contact-region 34b.

The digit-lines 22 are spaced from one another by gaps 80. In some embodiments, the gap between the first and third digit-lines DL1 and DL2 may be referred to as a first gap 80a, and the gap between the second and third digit-lines DL3 and DL2 may be referred to as a second gap 80b. Upper surfaces of the first insulative material 18a and the first storage-element-contact-region 34a are exposed along the bottom of the first gap 80a, and upper surfaces of the second insulative material 18b and the second storage-element-contact-region 34b are exposed along the bottom of the second gap 80b.

The digit-lines 22 (e.g., digit-lines DL1-DL4) are part of digit-line-stacks 65, with each stack comprising insulative material 66 over the digit-lines 22 (only the stack 65 comprising digit-line DL1 is labeled in FIG. 4 in order to simplify the drawing). The insulative material 66 may comprise any suitable composition(s); and in some embodiments may comprise, consist essentially of, or consist of silicon nitride. The insulative material 66 may be referred to as a third insulative material to distinguish it from the first and second insulative materials 42 and 50 described above with reference to FIG. 1A.

First insulative spacers 68 are formed along sidewalls of the stacks 65; and specifically are formed along the sidewall surfaces 27 of the digit-lines 22. In the shown embodiment, the spacers 68 comprise the same material 39 as is utilized to support the digit-line 22 passing over the intervening region 38 between the storage-element-contact-regions 34a and 34b. In some embodiments, such material 39 may comprise, consist essentially of, or consist of silicon dioxide. In other embodiments, the spacers 68 may comprise a different composition than the material 39.

Figure 4A:
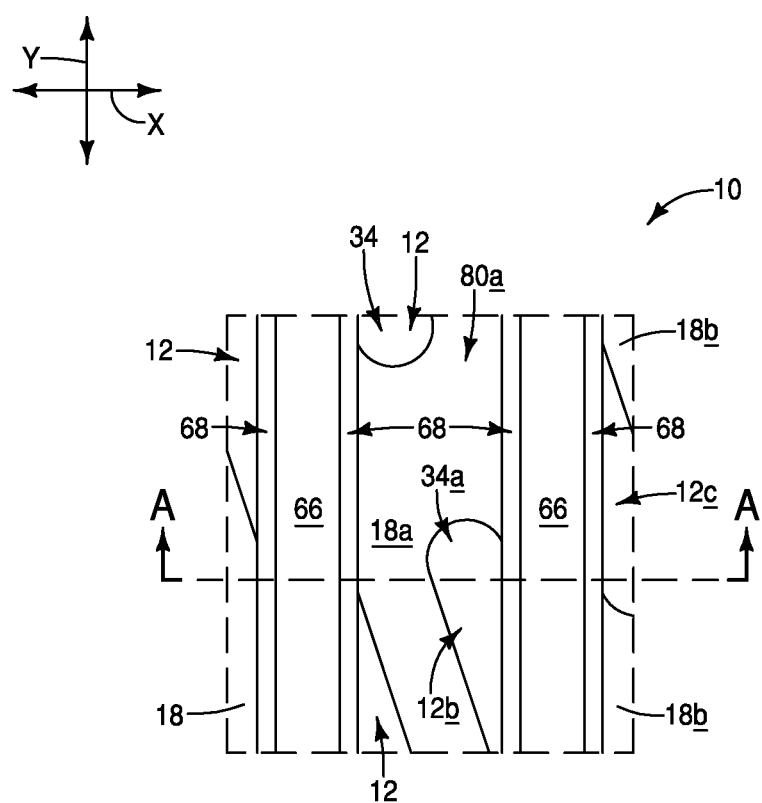
FIGS. 4A, 6A and 7A are top-down views along the lines D-D of FIGS. 4, 6 and 7; and regions of FIGS. 4, 6 and 7 are along the lines A-A of FIGS. 4A, 6A and 7A, respectively.

FIG. 4A shows a top-down view along a line D-D of FIG. 4, and shows the digit-line-stacks extending along the column direction of the y-axis.

Figure 5:
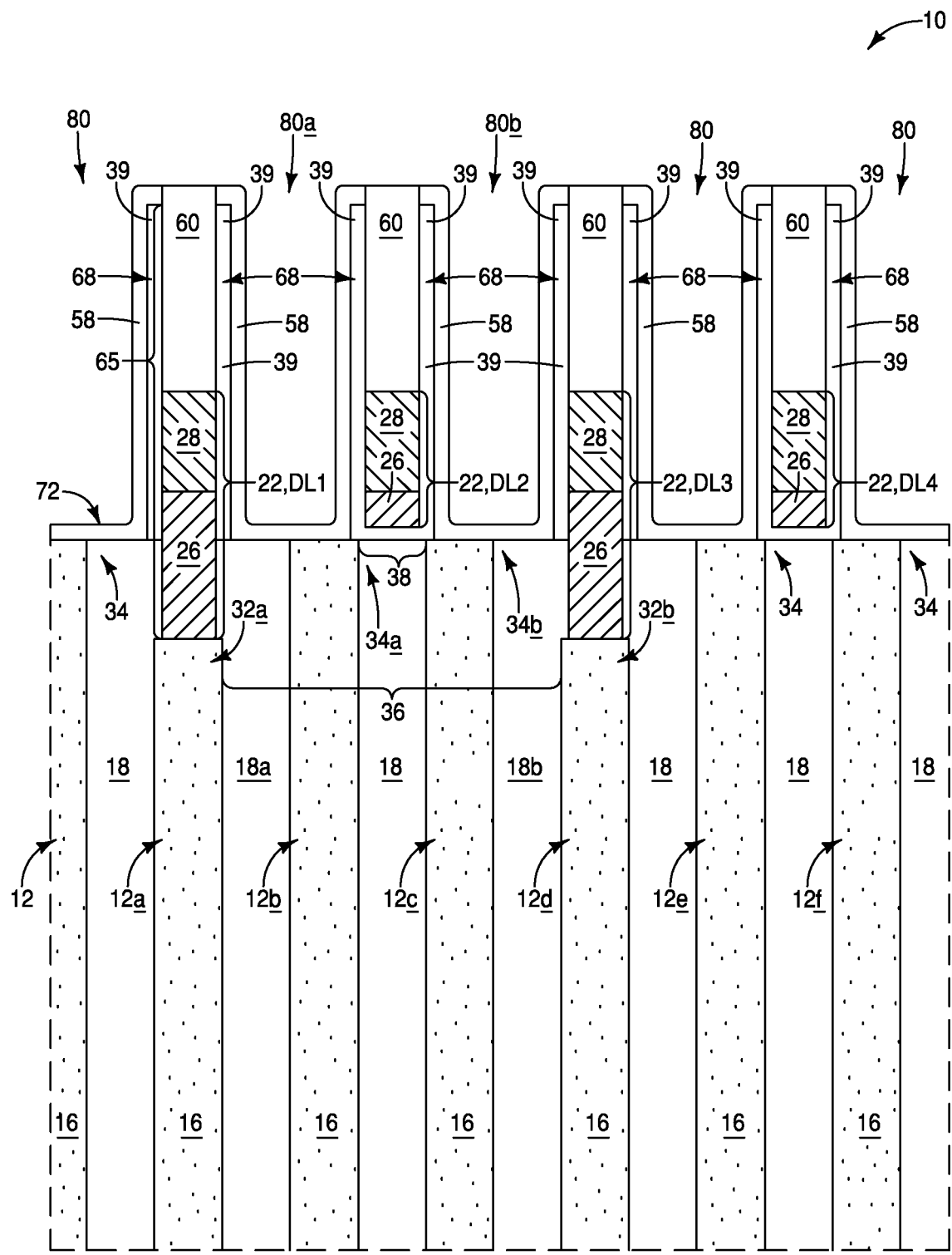

Referring to FIG. 5, insulative material 58 is formed over the spacers 68 and along the bottoms of the gaps 80. The insulative material 58 may be considered to be configured as a film 72. The insulative material 58 may comprise any suitable composition(s); and in some embodiments may comprise, consist essentially of, or consist of silicon nitride.

Figure 6:
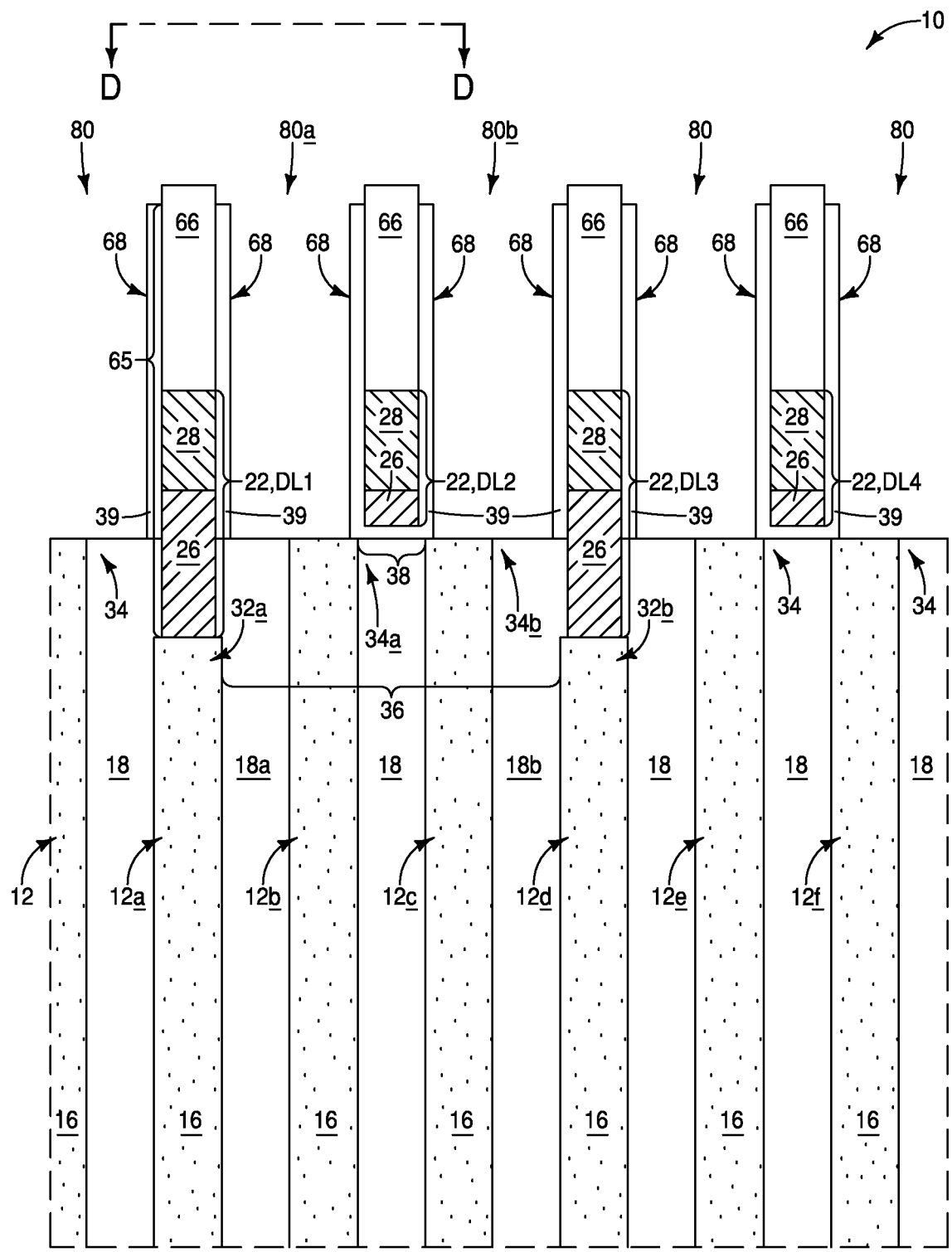
Figure 6A:
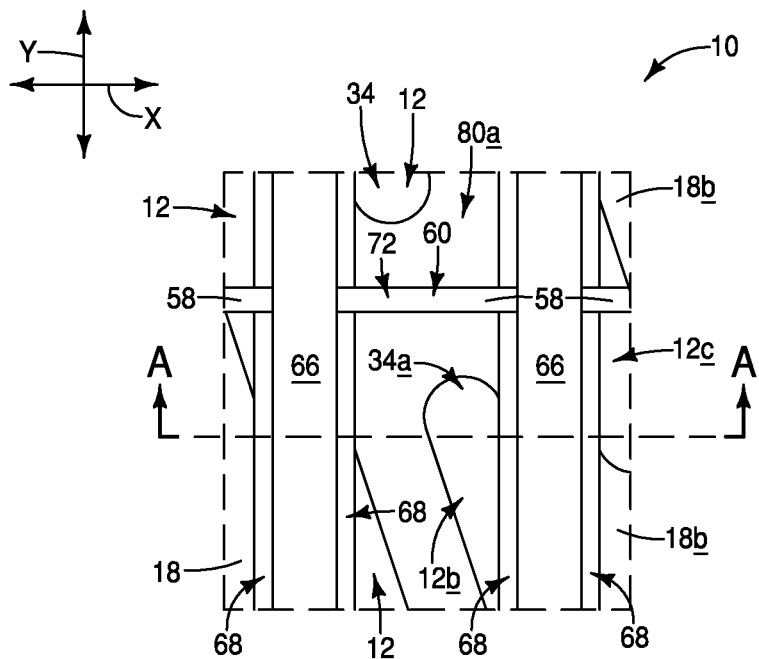

Referring to FIGS. 6 and 6A, the film 72 is patterned into the blocks 60 described above with reference to FIG. 1 (with the blocks 60 being shown in FIG. 6A). Such patterning removes the film 72 from along the cross-section of FIG. 6.

Figure 7A:
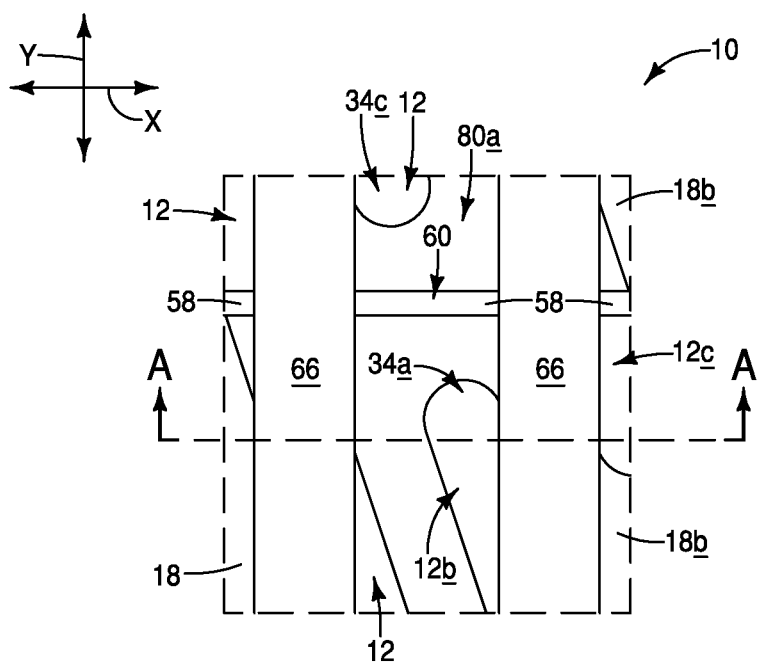
Figure 7:
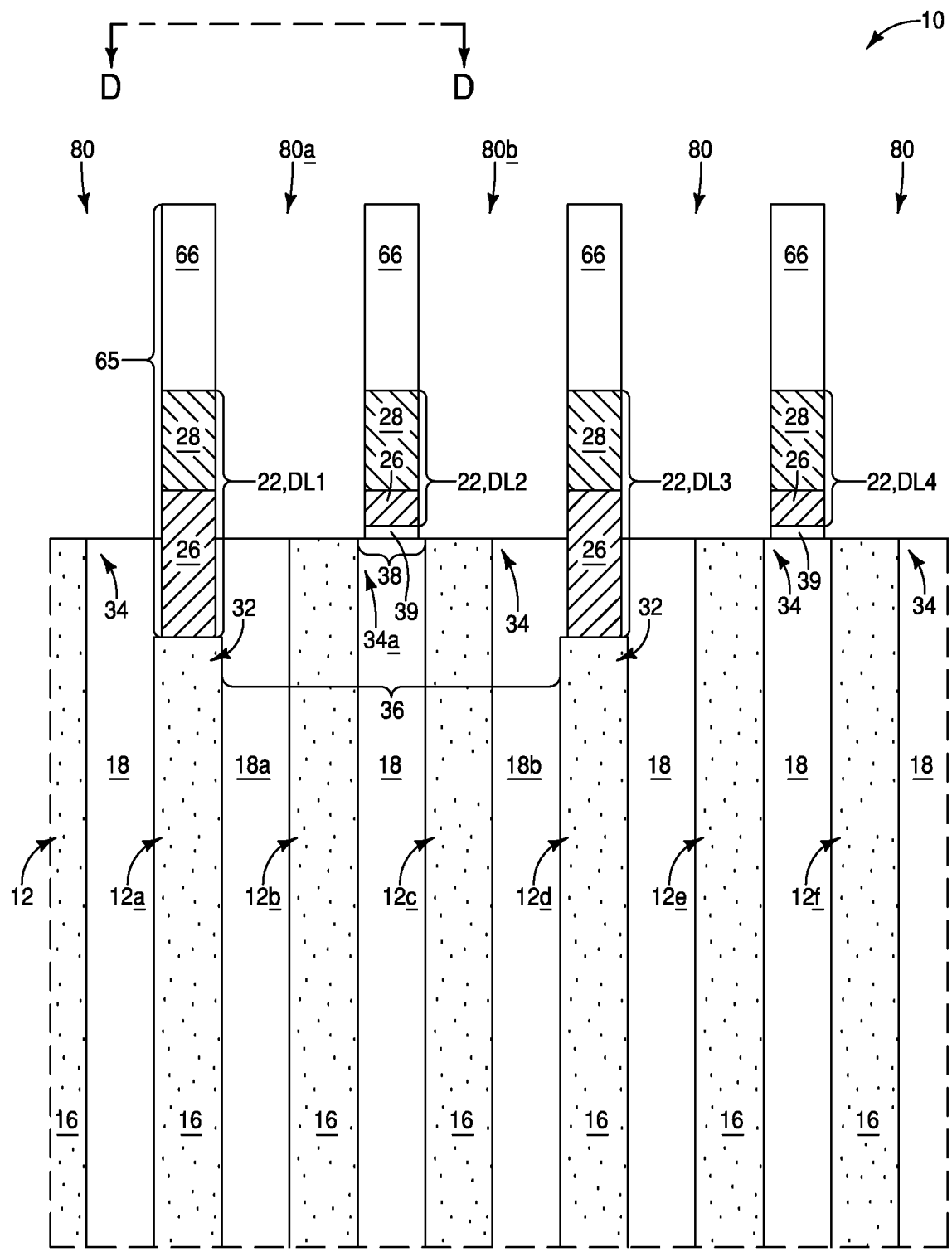

Referring to FIGS. 7 and 7A, the insulative spacers 68 (FIGS. 6 and 6A) are removed. In some embodiments, the view of FIG. 7A may be considered to show a first storage-element-contact-region 34a, and an additional storage-element-contact-region 34c adjacent the first storage-element-contact-region 34a; with the additional storage-element-contact-region 34c being spaced from the first storage-element-contact-region 34a along the y-axis direction. The insulative block 60 is formed across a region of a space between the first storage-element-contact-region 34a and the second storage-element-contact-region 34c.

Figure 8:
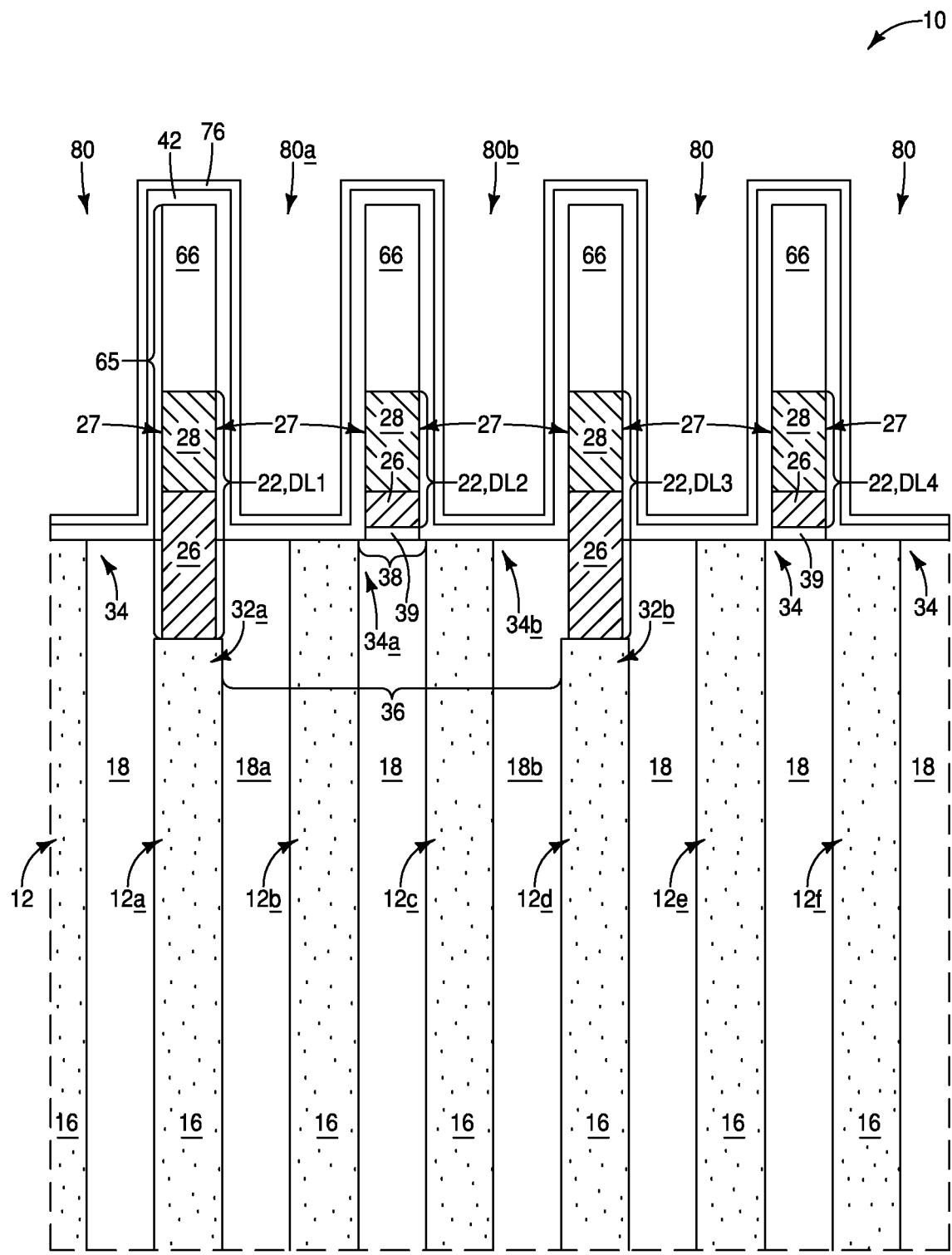

Referring to FIG. 8, the dielectric material 42 is formed to extend along the sidewall surfaces 27 of the digit-lines 22, over top surfaces of the digit-line-stacks 65, and along bottoms of the gaps 80. The dielectric material 42 preferably has low permittivity for reasons described above with first to FIGS. 1-1C; and in some embodiments the dielectric material 42 may be a low-k dielectric material (e.g., porous silicon dioxide, carbon-doped silicon dioxide, etc.).

Protective liner material 76 is formed over the dielectric material 42. The protective liner material may comprise any suitable composition(s); and in some embodiments may comprise, consist essentially of, or consist of silicon nitride. The protective liner material may protect the dielectric material 42 during subsequent etching and/or may provide advantages of filling pinhole openings which may be present along a surface of the material 42.

Figure 9:
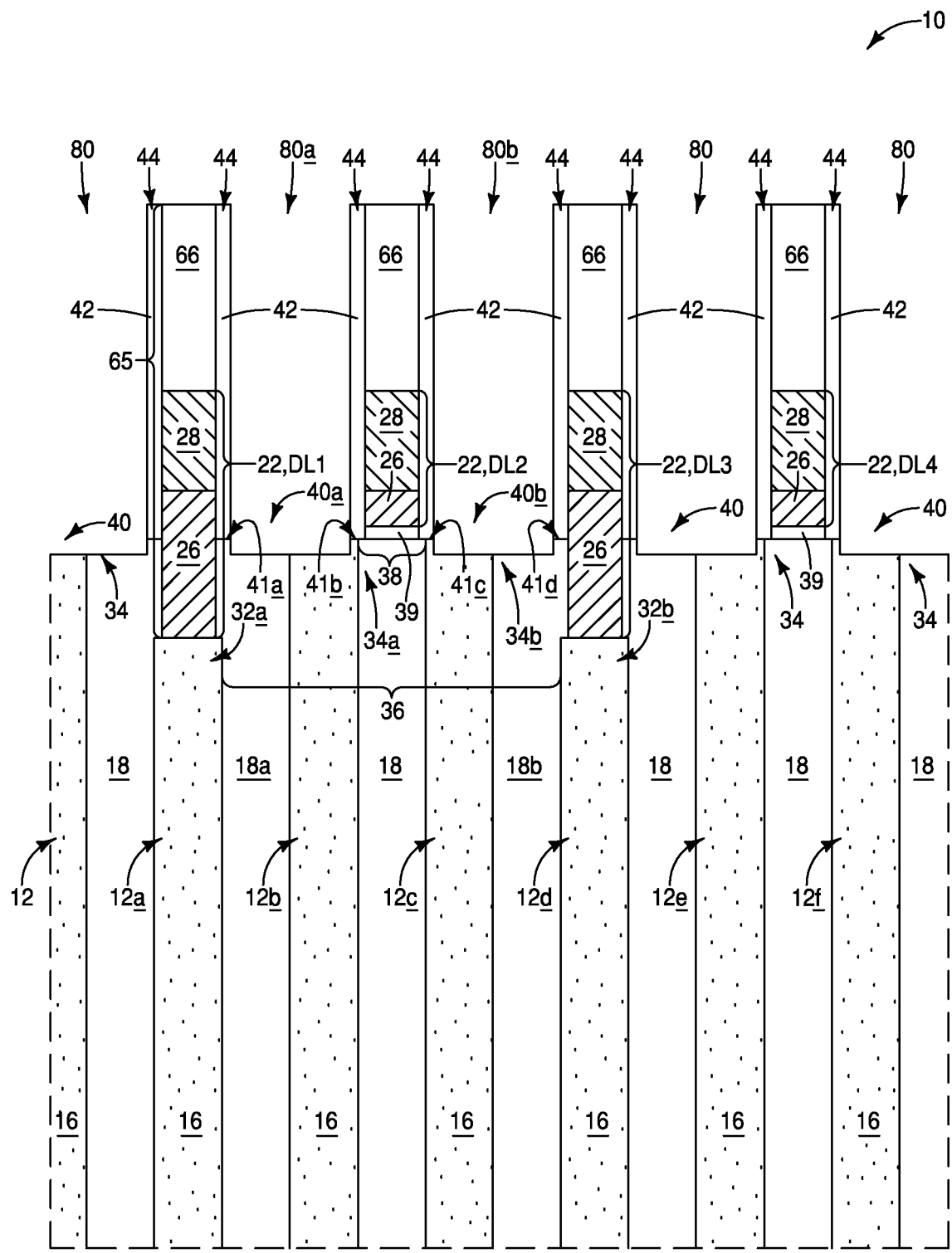

Referring to FIG. 9, the protective liner material 76 (FIG. 8) and the dielectric material 42 are anisotropically etched, and subsequently the liner material is removed. The remaining dielectric material 42 forms the insulative spacers 44. The spacers 44 may have top surfaces substantially coextensive with top surfaces of the digit-line-stacks 65 (as shown), or may have top surfaces which are vertically offset relative to the top surfaces of the digit-line-stacks. For instance, in some embodiments the spacers 44 may have top surfaces which are below the top surfaces of the digit-line-stacks.

In some embodiments, the insulative materials 18a, 18b, 66 and 42 may be referred to as first, second, third and fourth insulative materials, respectively. The insulative 42 may have a first dielectric constant, and the insulative material 66 may have a second dielectric constant greater than the first dielectric constant. The insulative material 42 may comprise any of the compositions described above with reference to FIGS. 1-1C; and in some embodiments may comprise one or more of silicon dioxide, carbon-doped silicon dioxide and porous silicon nitride. In some embodiments, the insulative material 42 may comprise low-k material (e.g., porous silicon dioxide) and the insulative material 66 may comprise high-k material (e.g., silicon nitride).

Still referring to FIG. 9, the insulative spacers 44 are utilized as a mask during an etch into the bottoms of the gaps 80 to form the cup-shaped indentations 40. In the shown embodiment, a first of the cup-shaped indentations is labeled as 40a, and such extends into the first insulative material 18a and the first storage-element-contact-region 34a; and a second of the cup-shaped indentations is labeled as 40b and such extends into the second insulative material 18b and the second storage-element-contact-region 34b. The first cup-shaped indentation 40a comprises the first and second upper ridges 41a and 41b along the cross-section of FIG. 9, and the second cup-shaped indentation 40b comprises the third and fourth upper ridges 41c and 41d along the cross-section of FIG. 9.

In the shown embodiment, the indentations 40 extend an equal depth into the storage-element-contact-regions 34 as into the insulative regions 18. In other embodiments, the indentations 40 may extend to a different depth into the storage-element-contact regions 34 than into the insulative regions 18; and may, for example, extend to be deeper into the storage-element-contact-regions 34 than into the insulative regions 18 (or vice versa).

Figure 10:
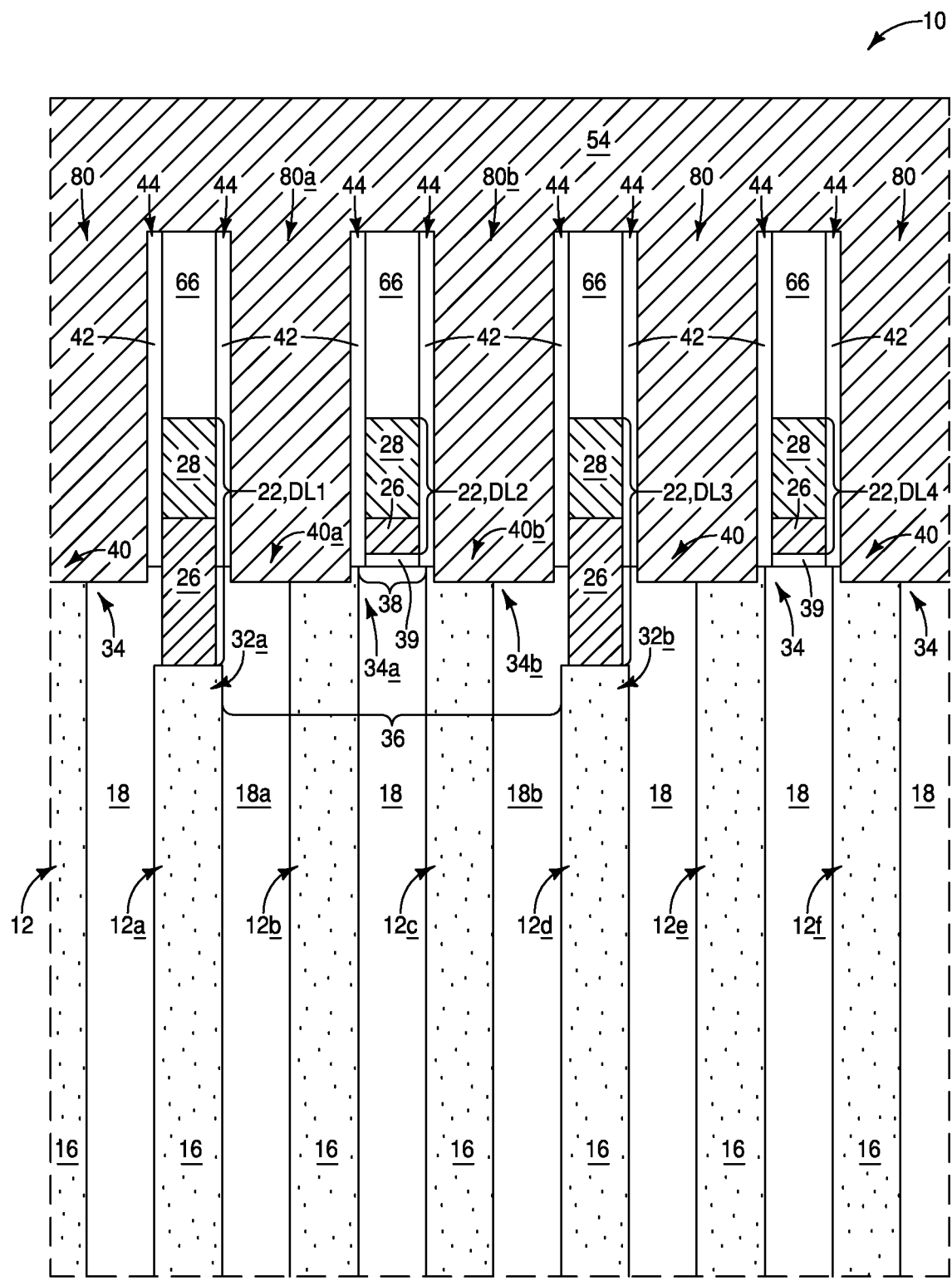

Referring to FIG. 10, conductive material 54 is formed within the gaps 80, and extends into the cup-shaped indentations 40.

Figure 11:
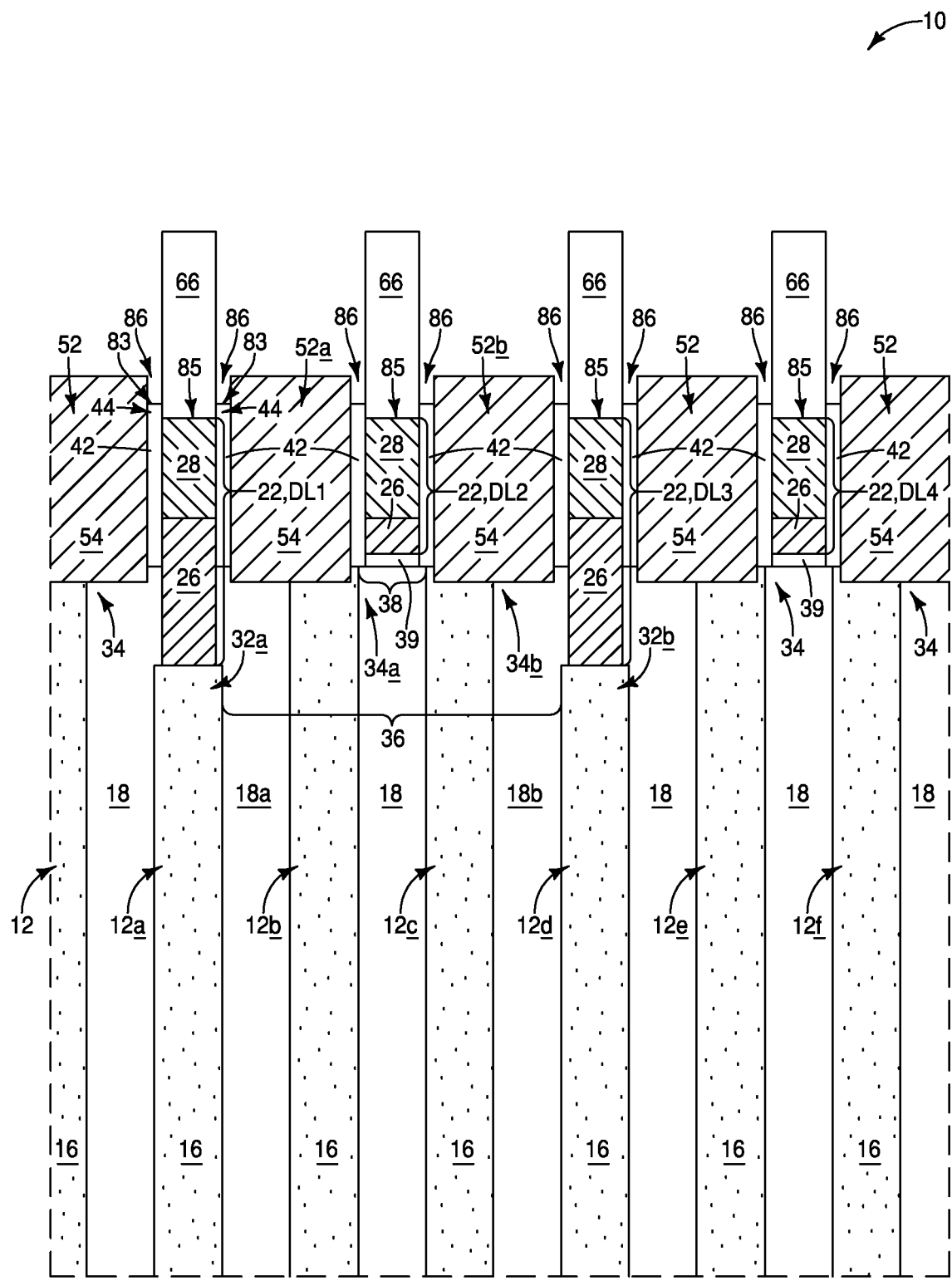

Referring to FIG. 11, the conductive material 54 is recessed to form the conductive interconnects 52; with two of such conductive interconnects being identified as first and second conductive interconnects 52a and 52b to be consistent with the description provided above with reference to FIGS. 1-1C. The spacers 44 are recessed relative to the third insulative material 66 and the conductive material 54 to form cavities 86 over the remaining portions of the spacers 44. The spacers may be recessed with a same etch as that utilized to recess the conductive material 54, or with a different etch. In the shown embodiment, the recessed spacers have top surfaces 83 above top surfaces 85 of the digit-lines 22.

Figure 12:
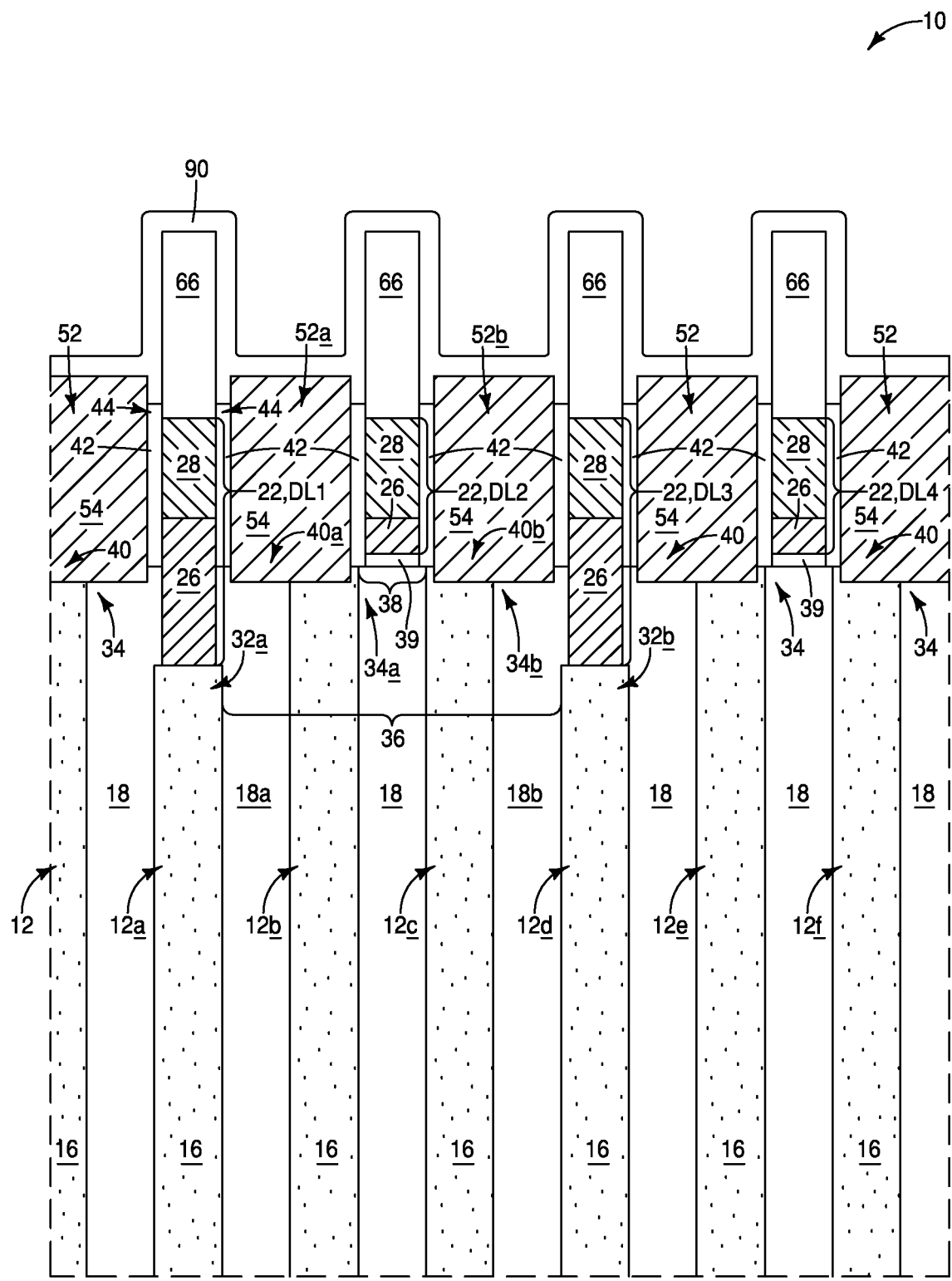

Referring to FIG. 12, fifth insulative material 90 is formed over the third insulative material 66 and the recessed spacers 44. The fifth insulative material 90 may comprise a same composition as the third insulative material 66, or may comprise a different composition than the third insulative material 66. In some embodiments, the insulative materials 66 and 90 may both comprise, consist essentially of, or consist of silicon nitride.

Figure 13:
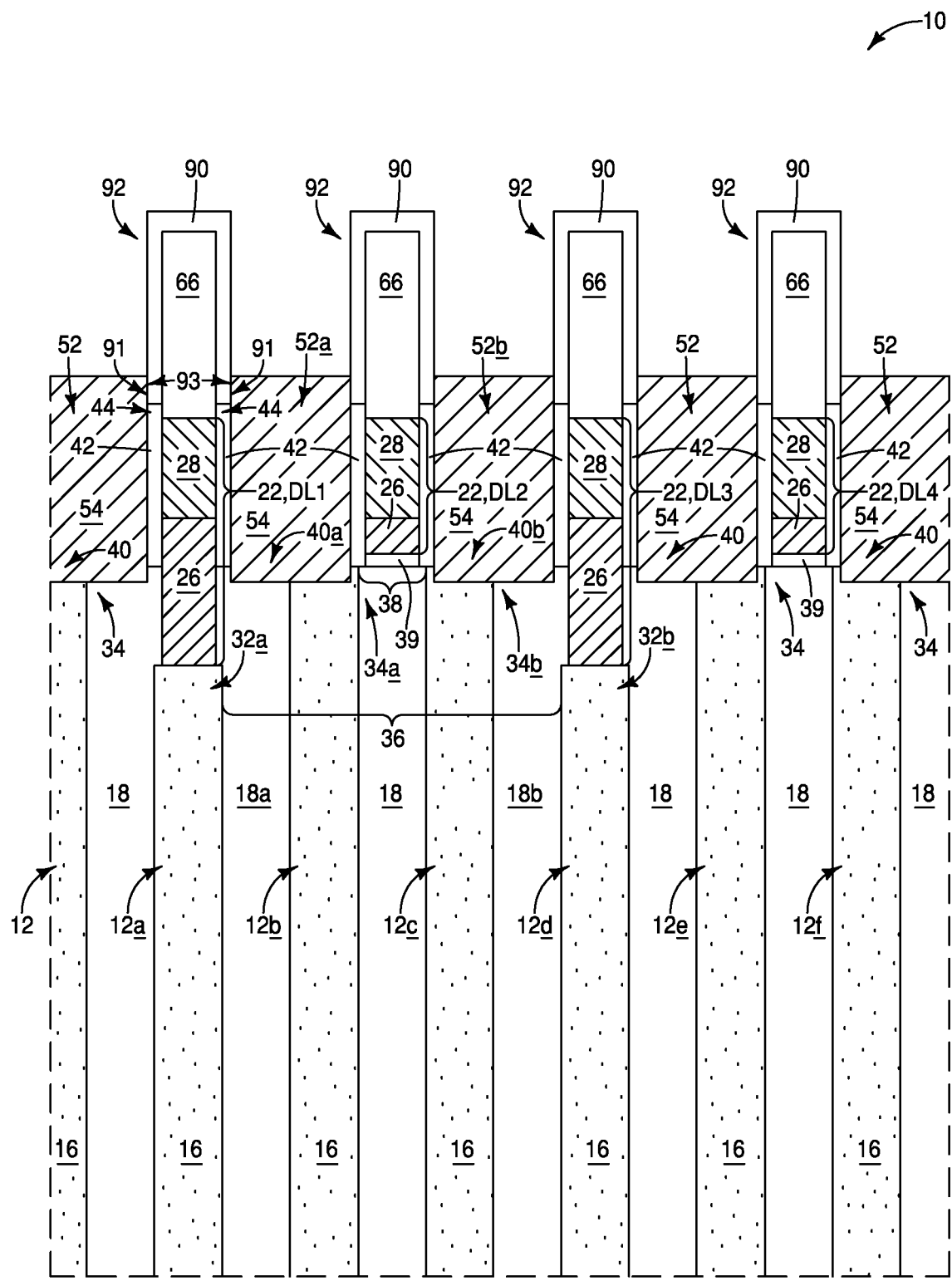

Referring to FIG. 13, the fifth insulative material 90 is patterned into insulative pillars 92 which extend upwardly from the third insulative material 66 and the recessed insulative pillars 44. In the shown embodiment, the lower sidewalls 91 of the insulative pillars 92 directly contact upper sidewall portions 93 of the conductive interconnects 52. If the materials 66 and 90 are the same composition as one another, they may together correspond to the material 50 shown in FIG. 1A.

Figure 14:
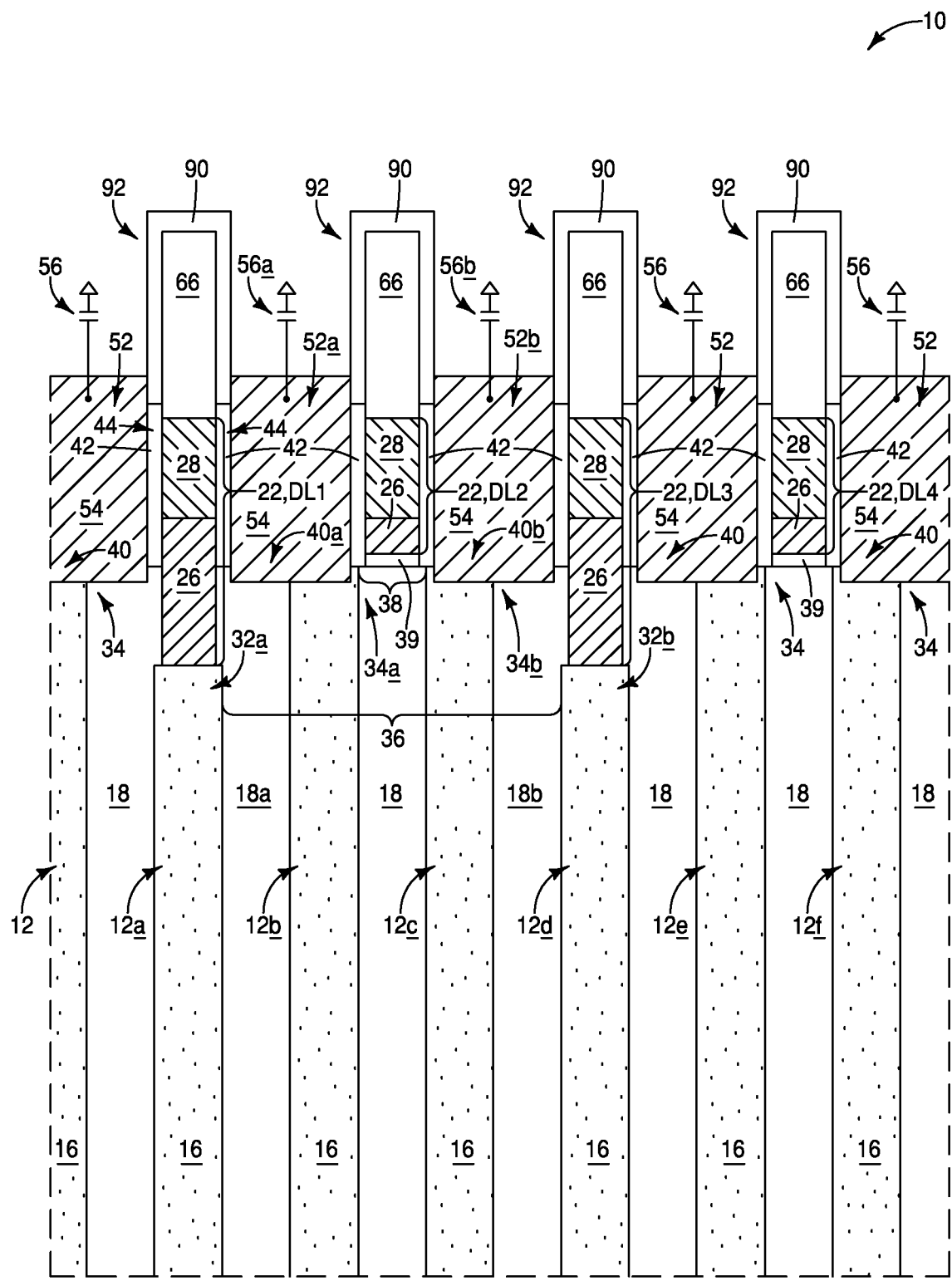

Referring to FIG. 14, the storage-elements (e.g., capacitors) 56 are coupled with the conductive interconnects 52. In the illustrated embodiment, two of the storage-elements are labeled as first and second storage-elements 56a and 56b, and are coupled with the first and second conductive interconnects 52a and 52b.

Figure 15:
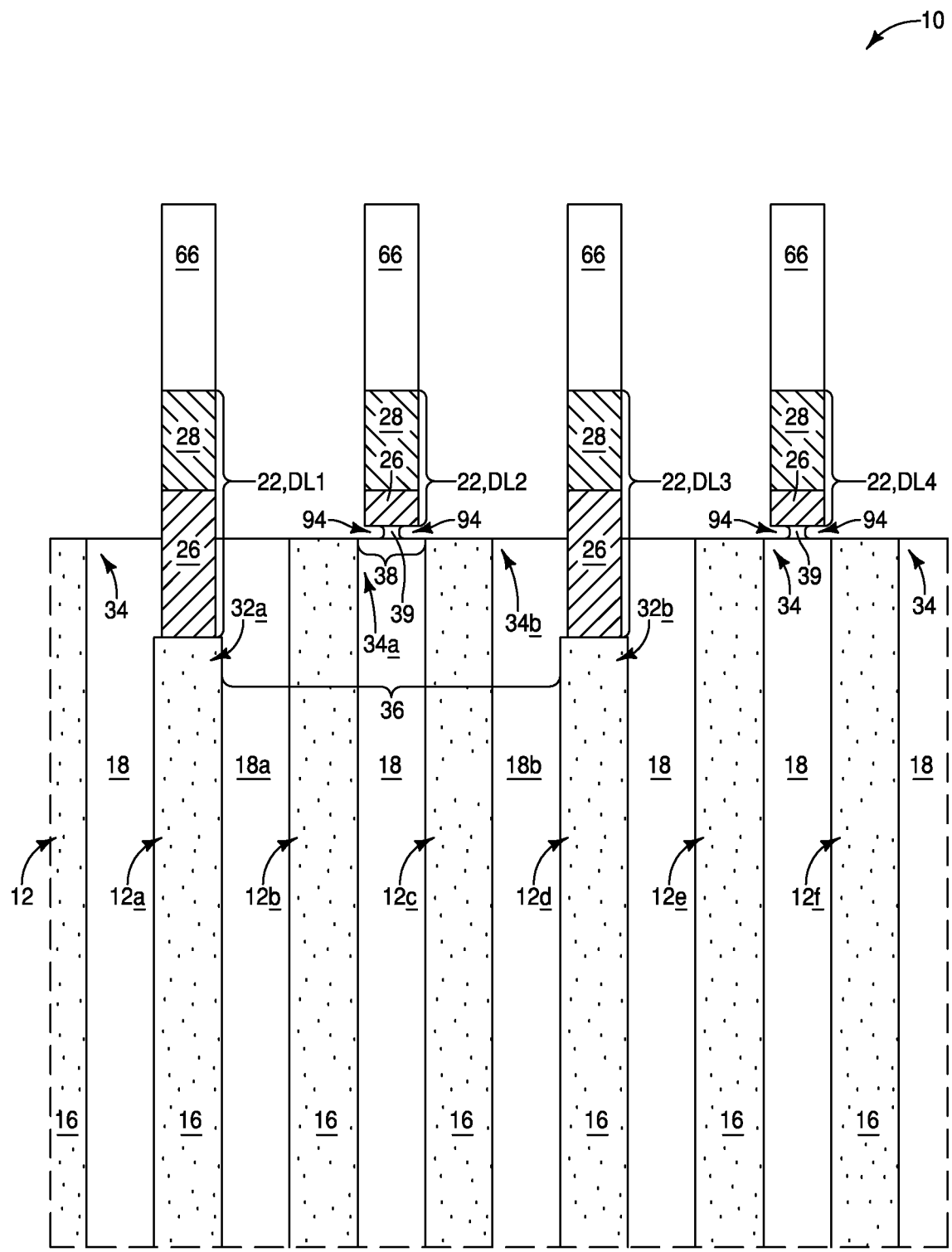
FIG. 15 is a diagrammatic cross-sectional side view of an example integrated assembly at an example process stage which may be alternative to that of FIG. 4 or which may follow that of FIG. 4.
Figure 16:
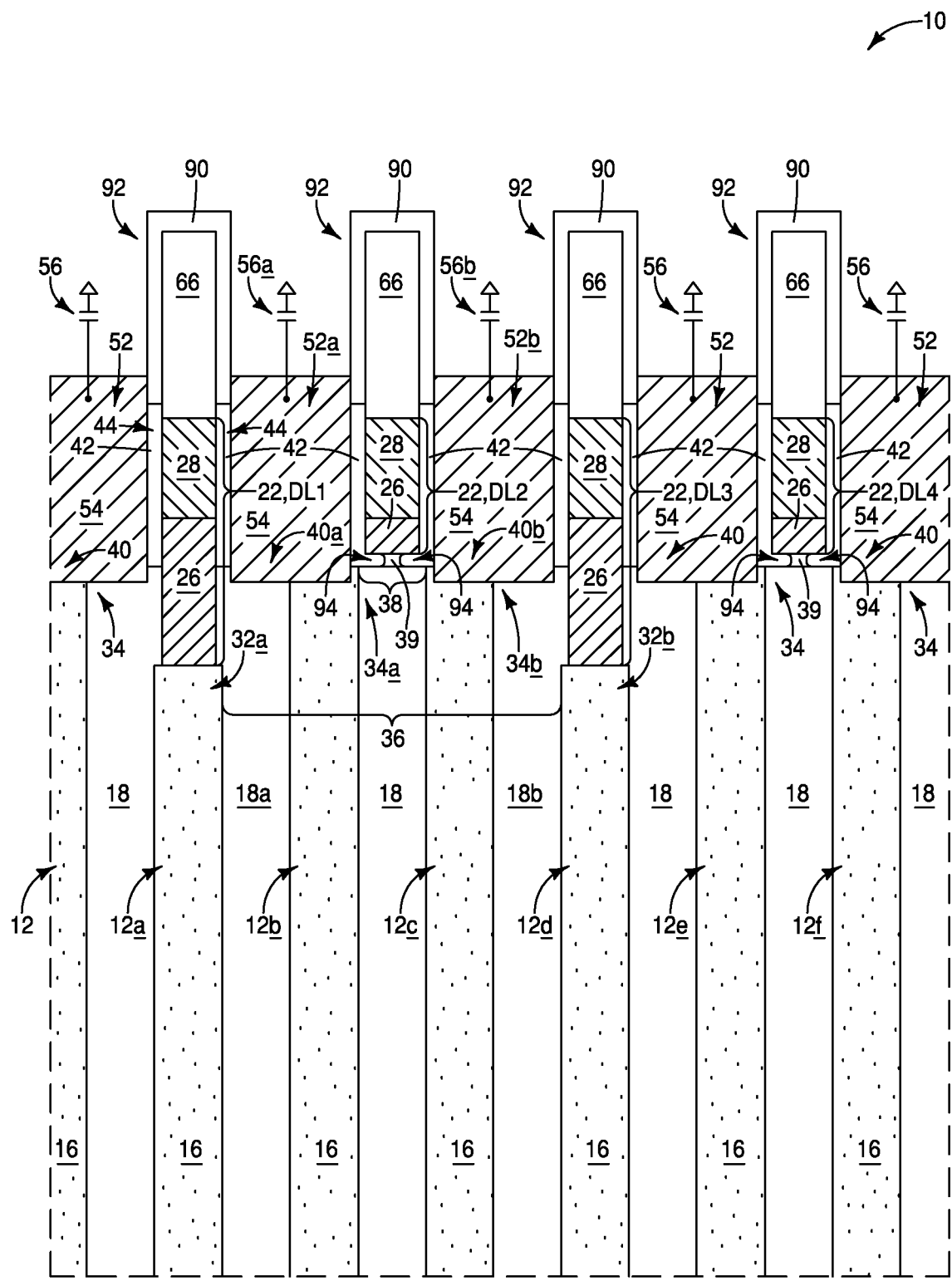
FIG. 16 is a diagrammatic cross-sectional side view of an example integrated assembly at an example process stage which may follow that of FIG. 15.

In some embodiments, the processing of FIGS. 4-6 may remove some of the material 39 from under the digit-lines passing over the intervening regions 38. For instance, FIG. 15 shows construction 10 at a processing stage alternative to that of FIG. 7, and shows some of the insulative material 39 removed from under the digit-lines DL2 and DL4 to leave cavities 94 extending under the digit-lines. In some embodiments, the insulative material 39 may be referred to as sixth insulative material to distinguish it from the first through fifth insulative materials described above. The spacer material 42 formed at the processing stage of FIG. 8 may extend into the cavities 94. FIG. 16 shows construction 10 at a processing stage subsequent to that of FIG. 15, and shows the spacer material 42 (referred to above as the fourth insulative material) extending into the cavities 94. The configuration of FIG. 16 is analogous to that of FIG. 14, except that the spacer material 42 extends to under the digit-lines DL2 and DL4.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a method of forming an integrated assembly. A construction is provided which has active-region-pillars extending upwardly from a base. Each of the active-region-pillars has a pair of storage-element-contact-regions, and has a digit-line-contact-region between the storage-element-contact-regions. The construction includes, along a cross-section, a first of the digit-line-contact-regions spaced from a second of the digit-linecontact-regions by a first intervening region comprising a first of the storage-element-contact-regions and a second of the storage-element-contact-regions. The first and second digit-line-contact-regions are recessed relative to the first and second storage-element-contact-regions. The first and second storage-element-contact-regions are spaced from one another by a second intervening region. A first digit-line is coupled with the first digit-line-contact-region, a second digit-line is coupled with the second digit-line-contact-region, and a third digit-line is formed to pass over the second intervening region. The first, second and third digit-lines have sidewall surfaces. The first and third digit-lines are spaced from one another by a first gap, and the second and third digit-lines are spaced from one another by a second gap. A first insulative material is between the first digit-line and the first storage-element-contact-region, and a second insulative material is between the second digit-line and the second storage-element-contact-region. Upper surfaces of the first and second storage-element-contact-regions are exposed along bottoms of the first and second gaps. Upper surfaces of the first and second insulative materials are exposed along the bottoms of the first and second gaps. The first, second and third digit-lines are part of first, second and third digit-line-stacks, respectively. Said stacks have third insulative material over the first, second and third digit-lines. Insulative spacers are formed along the sidewall surfaces of the first, second and third digit-lines. The insulative spacers comprise a fourth insulative material having a first dielectric constant. The third insulative material has a second dielectric constant greater than the first dielectric constant. The insulative spacers are used as a mask during an etch into the bottoms of gaps. The etching forms a first cup-shaped indentation extending into the first insulative material and the first storage-element-contact-region, with the first cup-shaped indentation having a first upper ridge along the upper surface of the first insulative material and having a second upper ridge along the upper surface of the first storage-element-contact-region; and the etching forms a second cup-shaped indentation extending into the second insulative material and the second storage-element-contact-region, with the second cup-shaped indentation having a third upper ridge along the upper surface of the second storage-element-contact-region and having a fourth upper ridge along the upper surface of the second insulative material. First and second conductive interconnects are formed within the first and second cup-shaped indentations. The insulative spacers are recessed relative to the third insulative material. Fifth insulative material is formed over the third insulative material and the recessed insulative spacers.

Some embodiments include an integrated assembly which includes active-region-pillars extending upwardly from a base. Each of the active-region-pillars has a pair of storage-element-contact-regions, and has a digit-line-contact-region between the storage-element-contact-regions. The integrated assembly includes, along a cross-section, a first of the digit-line-contact-regions adjacent a first of the storage-element-contact-regions. The first digit-line-contact-region is recessed relative to the first storage-element-contact-region. A first digit-line is coupled with the first digit-line-contact-region. A second digit-line is laterally offset from the first digit-line. An insulative material is between the first digit-line and the first storage-element-contact-region. A cup-shaped indentation extends into the insulative material and the first storage-element-contact-region. The cup-shaped indentation has a first upper ridge along a surface of the insulative material and has a second upper ridge along a surface of the first storage-element-contact-region. Insulative spacers are along sidewall surfaces of the first and second digit-lines. The insulative spaces include first material having a first dielectric constant. The insulative spacers along the sidewall surfaces of the first digit-line are first and second insulative spacers, and the insulative spacers along the sidewall surfaces of the second digit-line are third and fourth insulative spacers. The second and third insulative spacers contact the first and second upper ridges, respectively. A first recess is between the first and second insulative spacers and over the first digit-line, and a second recess is between the third and fourth insulative spacers and over the second digit-line. A first insulative pillar is over the first digit-line, is over the first and second insulative spacers, and extends into the first recess. A second insulative pillar is over the second digit-line, is over the third and fourth insulative spacers, and extends into the second recess. The first and second insulative pillars include second material having a second dielectric constant greater than the first dielectric constant.

Some embodiments include an integrated assembly comprising active-region-pillars extending upwardly from a base. Each of the active-region-pillars has a pair of storage-element-contact-regions, and has a digit-line-contact-region between the storage-element-contact-regions. The integrated assembly includes, along a cross-section, a first of the digit-line-contact-regions spaced from a second of the digit-line-contact-regions by a first intervening region comprising a first of the storage-element-contact-regions and a second of the storage-element-contact-regions. The first and second digit-line-contact-regions are recessed relative to the first and second storage-element-contact-regions. The first and second storage-element-contact-regions are spaced from one another by a second intervening region. A first digit-line is coupled with the first digit-line-contact-region and extends upwardly from the first digit-line-contact-region. A second digit-line is coupled with the second digit-line-contact-region and extends upwardly from the second digit-line-contact-region. A third digit-line passes over the second intervening region. A first insulative material is between the first digit-line and the first storage-element-contact-region. A second insulative material is between the second digit-line and the second storage-element-contact-region. A first cup-shaped indentation extends into the first insulative material and the first storage-element-contact-region. The first cup-shaped indentation has a first upper ridge along a surface of the first insulative material and has a second upper ridge along a surface of the first storage-element-contact-region. A second cup-shaped indentation extends into the second insulative material and the second storage-element-contact-region. The second cup-shaped indentation has a third upper ridge along a surface of the second storage-element-contact-region and has a fourth upper ridge along a surface of the second insulative material. Insulative spacers are along sidewall surfaces of the first, second and third digit-lines. The insulative spaces comprise first material having a dielectric constant less than or equal to about 5. The insulative spacers along the sidewall surfaces of the first digit-line are first and second insulative spacers, the insulative spacers along the sidewall surfaces of the second digit-line are third and fourth insulative spacers, and the insulative spacers along the sidewalls surfaces of the third digit-line are fifth and sixth insulative spacers. The fifth and sixth insulative spacers contact the second and third upper ridges, respectively. The second insulative spacer contacts the first upper ridge, and the third insulative spacer contacts the fourth upper ridge. The insulative spacers extend upwardly to above upper surfaces of the digit-lines. A first recess is between the first and second insulative spacers and over the first digit-line, a second recess is between the third and fourth insulative spacers and over the second digit-line, and a third recess is between the fifth and sixth insulative spacers and over the third digit-line. A first insulative pillar is over the first digit-line and over the first and second insulative spacers, and extends into the first recess. A second insulative pillar is over the second digit-line and over the third and fourth insulative spacers, and extends into the second recess. A third insulative pillar is over the third digit-line and over the fifth and sixth insulative spacers, and extends into the third recess. The first, second and third insulative pillars comprise second material having a dielectric constant greater than 5. A first conductive interconnect is within the first cup-shaped indentation. A second conductive interconnect is within the second cup-shaped indentation. First and second storage-elements are coupled with the first and second conductive interconnects, respectively.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an integrated assembly, comprising:
    providing a construction having active-region-pillars extending upwardly from a base; each of the active-region-pillars having a pair of storage-element-contact-regions, and having a digit-line-contact-region between the storage-element-contact-regions; the construction including, along a cross-section, a first of the digit-line-contact-regions spaced from a second of the digit-line-contact-regions by a first intervening region comprising a first of the storage-element-contact-regions and a second of the storage-element-contact-regions; the first and second digit-line-contact-regions being recessed relative to the first and second storage-element-contact-regions; the first and second storage-element-contact-regions being spaced from one another by a second intervening region;
    forming a first digit-line coupled with the first digit-line-contact-region, a second digit-line coupled with the second digit-line-contact-region, and a third digit-line passing over the second intervening region; the first, second and third digit-lines having sidewall surfaces; the first and third digit-lines being spaced from one another by a first gap, and the second and third digit-lines being spaced from one another by a second gap; a first insulative material being between the first digit-line and the first storage-element-contact-region, and a second insulative material being between the second digit-line and the second storage-element-contact-region; upper surfaces of the first and second storage-element-contact-regions being exposed along bottoms of the first and second gaps; upper surfaces of the first and second insulative materials being exposed along the bottoms of the first and second gaps; the first, second and third digit-lines being part of first, second and third digit-line-stacks, respectively; said stacks having third insulative material over the first, second and third digit-lines;
    forming insulative spacers along the sidewall surfaces of the first, second and third digit-lines; the insulative spacers comprising a fourth insulative material having a first dielectric constant; the third insulative material having a second dielectric constant greater than the first dielectric constant;
    using the insulative spacers as a mask during an etch into the bottoms of gaps; the etching forming a first cup-shaped indentation extending into the first insulative material and the first storage-element-contact-region, with the first cup-shaped indentation having a first upper ridge along the upper surface of the first insulative material and having a second upper ridge along the upper surface of the first storage-element-contact-region; and the etching forming a second cup-shaped indentation extending into the second insulative material and the second storage-element-contact-region, with the second cup-shaped indentation having a third upper ridge along the upper surface of the second storage-element-contact-region and having a fourth upper ridge along the upper surface of the second insulative material;
    forming first and second conductive interconnects within the first and second cup-shaped indentations;
    recessing the insulative spacers relative to the third insulative material; and
    forming fifth insulative material over the third insulative material and the recessed insulative spacers.

2. The method of claim 1 wherein the active-region-pillars and the base comprise a semiconductor material.

3. The method of claim 2 wherein the semiconductor material includes one or both of silicon and germanium.

4. The method of claim 1 wherein the cross-section is along a first direction; wherein an additional storage-element-contact-region is adjacent the first storage-element-contact-region along a second direction orthogonal to the first direction, and is spaced from the first storage-element-contact-region; and further comprising, prior to forming the insulative spacers, forming an insulative block across a region of the space between the first storage-element-contact-region and the additional storage-element-contact-region.

5. The method of claim 4 wherein at least part of the insulative block is patterned from a film of insulative material, wherein the insulative spacers are second spacers, and wherein the forming of the insulative block includes, along the cross-section:
    forming first spacers along the sidewall surfaces of the first, second and third digit-lines;
    forming the film over the first spacers and along the bottoms of the first and second gaps;
    removing the film; and
    removing the first spacers.

6. The method of claim 1 further comprising patterning the fifth insulative material into insulative pillars extending upwardly from the third insulative material and the recessed insulative spacers, and wherein lower sidewall regions of said insulative pillars directly contact upper sidewall regions of the conductive interconnects.

7. The method of claim 1 wherein top surfaces of the recessed insulative spacers are above top surfaces of the digit-lines.

8. The method of claim 1 further comprising forming first and second storage-elements coupled with the first and second conductive interconnects, respectively.

9. The method of claim 8 wherein the first and second storage-elements are capacitors.

10. The method of claim 1 wherein the fourth insulative material of the insulative spacers comprises low-k dielectric material; and further comprising:
- forming the low-k dielectric material to extend along the sidewall surfaces of the digit-lines, over top surfaces of the digit-line-stacks, and along the bottoms of the first and second gaps;
- forming a protective liner material over the low-k dielectric material;
- anisotropically etching the protective liner material and the low-k dielectric material to form the insulative spacers; and
- removing the protective liner material.

11. The method of claim 10 wherein the protective liner material comprises silicon nitride.

12. The method of claim 1 wherein the fourth insulative material comprises one or more of porous silicon dioxide, carbon-doped silicon dioxide and porous silicon nitride.

13. The method of claim 1 wherein the fourth insulative material has a dielectric constant less than 3.9.

14. The method of claim 1 wherein the fifth insulative material is a same composition as the third insulative material.

15. The method of claim 1 wherein the fifth insulative material and the third insulative material both comprise silicon nitride.

16. The method of claim 1 wherein the third digit-line is supported over a sixth insulative material; and further comprising:
- etching into the sixth insulative material to form cavities extending under the third digit-line; and
- forming the fourth insulative material to extend into the cavities.

17. An integrated assembly, comprising:
- active-region-pillars extending upwardly from a base; each of the active-region-pillars having a pair of storage-element-contact-regions, and having a digit-line-contact-region between the storage-element-contact-regions; the integrated assembly including, along a cross-section, a first of the digit-line-contact-regions adjacent a first of the storage-element-contact-regions; the first digit-line-contact-region being recessed relative to the first storage-element-contact-region;
- a first digit-line coupled with the first digit-line-contact-region; a second digit-line laterally offset from the first digit-line;
- an insulative material between the first digit-line and the first storage-element-contact-region;
- a cup-shaped indentation extending into the insulative material and the first storage-element-contact-region; the cup-shaped indentation having a first upper ridge along a surface of the insulative material and having a second upper ridge along a surface of the first storage-element-contact-region;
- insulative spacers along sidewall surfaces of the first and second digit-lines; the insulative spaces comprising first material having a first dielectric constant; the insulative spacers along the sidewall surfaces of the first digit-line being first and second insulative spacers, and the insulative spacers along the sidewall surfaces of the second digit-line being third and fourth insulative spacers; the second and third insulative spacers contacting the first and second upper ridges, respectively;
- a first recess being between the first and second insulative spacers and over the first digit-line, and a second recess being between the third and fourth insulative spacers and over the second digit-line; and
- a first insulative pillar over the first digit-line and over the first and second insulative spacers, and extending into the first recess; a second insulative pillar over the second digit-line and over the third and fourth insulative spacers, and extending into the second recess; the first and second insulative pillars comprising second material having a second dielectric constant greater than the first dielectric constant.

18. The integrated assembly of claim 17 wherein the first and second digit-lines comprise metal-containing material over doped semiconductor material.

19. The integrated assembly of claim 17 wherein the first material of the insulative spacers extends to under the second digit-line.

20. The integrated assembly of claim 17 wherein the first material has a dielectric constant less than 3.9; and wherein the second material has a dielectric constant greater than or equal to 7.5.

21. The integrated assembly of claim 17 wherein the first material comprises one or more of porous silicon dioxide, carbon-doped silicon dioxide and porous silicon nitride; and wherein the second material comprises silicon nitride.

22. The integrated assembly of claim 17 further comprising:
- a conductive interconnect within the cup-shaped indentation; and
- a storage-element coupled with the conductive interconnect.

23. An integrated assembly, comprising:
- active-region-pillars extending upwardly from a base; each of the active-region-pillars having a pair of storage-element-contact-regions, and having a digit-line-contact-region between the storage-element-contact-regions; the integrated assembly including, along a cross-section, a first of the digit-line-contact-regions spaced from a second of the digit-line-contact-regions by a first intervening region comprising a first of the storage-element-contact-regions and a second of the storage-element-contact-regions; the first and second digit-line-contact-regions being recessed relative to the first and second storage-element-contact-regions; the first and second storage-element-contact-regions being spaced from one another by a second intervening region;
- a first digit-line coupled with the first digit-line-contact-region and extending upwardly from the first digit-line-contact-region; a second digit-line coupled with the second digit-line-contact-region and extending upwardly from the second digit-line-contact-region; a third digit-line passing over the second intervening region;
- a first insulative material between the first digit-line and the first storage-element-contact-region; a second insulative material between the second digit-line and the second storage-element-contact-region;
- a first cup-shaped indentation extending into the first insulative material and the first storage-element-contact-region; the first cup-shaped indentation having a first upper ridge along a surface of the first insulative material and having a second upper ridge along a surface of the first storage-element-contact-region; a second cup-shaped indentation extending into the second insulative material and the second storage-element-contact-region; the second cup-shaped indentation having a third upper ridge along a surface of the second storage-element-contact-region and having a fourth upper ridge along a surface of the second insulative material;

insulative spacers along sidewall surfaces of the first, second and third digit-lines; the insulative spaces comprising first material having a dielectric constant less than or equal to about 5; the insulative spacers along the sidewall surfaces of the first digit-line being first and second insulative spacers, the insulative spacers along the sidewall surfaces of the second digit-line being third and fourth insulative spacers, and the insulative spacers along the sidewalls surfaces of the third digit-line being fifth and sixth insulative spacers; the fifth and sixth insulative spacers contacting the second and third upper ridges, respectively; the second insulative spacer contacting the first upper ridge, and the third insulative spacer contacting the fourth upper ridge; the insulative spacers extending upwardly to above upper surfaces of the digit-lines; a first recess being between the first and second insulative spacers and over the first digit-line, a second recess being between the third and fourth insulative spacers and over the second digit-line, and a third recess being between the fifth and sixth insulative spacers and over the third digit-line;

a first insulative pillar over the first digit-line and over the first and second insulative spacers, and extending into the first recess; a second insulative pillar over the second digit-line and over the third and fourth insulative spacers, and extending into the second recess; a third insulative pillar over the third digit-line and over the fifth and sixth insulative spacers, and extending into the third recess; the first, second and third insulative pillars comprising second material having a dielectric constant greater than 5;

a first conductive interconnect within the first cup-shaped indentation; a second conductive interconnect within the second cup-shaped indentation; and first and second storage-elements coupled with the first and second conductive interconnects, respectively.

24. The integrated assembly of claim 23 wherein sidewall surfaces of upper portions of the first and second conductive interconnects are directly against sidewall surfaces of the first, second and third insulative pillars.

25. The integrated assembly of claim 23 wherein the first material of the insulative spacers extends to under the third digit-line.

26. The integrated assembly of claim 23 wherein the first material of the insulative spacers comprises carbon-doped silicon dioxide.

27. The integrated assembly of claim 23 wherein the first material of the insulative spacers comprises porous silicon dioxide.

28. The integrated assembly of claim 23 wherein the first material of the insulative spacers comprises porous silicon nitride.

29. The integrated assembly of claim 23 wherein the first and second conductive interconnects comprise metal.

30. The integrated assembly of claim 23 wherein the second material of the first, second and third insulative pillars comprises silicon nitride.

31. The integrated assembly of claim 23 wherein the first and second storage-elements are capacitors.

* * * * *